United States Patent
Fujioka et al.

(10) Patent No.: US 7,032,142 B2
(45) Date of Patent: Apr. 18, 2006

(54) MEMORY CIRCUIT HAVING PARITY CELL ARRAY

(75) Inventors: Shinya Fujioka, Kawasaki (JP); Waichiro Fujieda, Kawasaki (JP); Kota Hara, Kawasaki (JP); Toru Koga, Kawasaki (JP); Katsuhiro Mori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 436 days.

(21) Appl. No.: 10/271,533

(22) Filed: Oct. 17, 2002

(65) Prior Publication Data
US 2003/0106010 A1 Jun. 5, 2003

(30) Foreign Application Priority Data
Nov. 22, 2001 (JP) ............................. 2001-358102
Dec. 7, 2001 (JP) ............................. 2001-374136

(51) Int. Cl.
G11C 29/00 (2006.01)
G11C 7/00 (2006.01)
G06F 11/00 (2006.01)

(52) U.S. Cl. ................... 714/718; 714/800; 365/200; 365/201; 365/222

(58) Field of Classification Search ............ 365/200, 365/201, 168, 222, 230.03; 714/718, 763, 714/800, 805, 820
See application file for complete search history.

(56) References Cited

U.S. PATENT DOCUMENTS

| 4,706,249 A | 11/1987 | Nakagawa et al. |
| 4,794,597 A | 12/1988 | Ooba et al. |
| 6,185,718 B1 | 2/2001 | Dell et al. |
| 6,233,717 B1 * | 5/2001 | Choi ........................... 714/805 |
| 2004/0221143 A1 * | 11/2004 | Wise et al. ................. 712/300 |

FOREIGN PATENT DOCUMENTS

WO 81/03567 12/1981

OTHER PUBLICATIONS

U.S. Appl. No. 10/001,790, filed Dec. 5, 2001.

* cited by examiner

Primary Examiner—Guy Lamarre
Assistant Examiner—John J. Tabone, Jr.
(74) Attorney, Agent, or Firm—Arent Fox PLLC

(57) ABSTRACT

A memory circuit has: a real cell array; a parity generating circuit for generating a parity bit from data of the real cell array; a parity cell array; a refresh control circuit, which sequentially refreshes the real cell array, and when an internal refresh request and a read request coincide, prioritizes a refresh operation; a data recovery section, which, in accordance with the parity bit read out from the parity cell array, recovers data read out from the real cell array; and an output circuit for outputting data from the real cell array. Further, the memory circuit has a test control circuit, which, at a first test mode, prohibits a refresh operation for the real cell array to output data read out from the real cell array, and, at a second test mode, controls the output circuit so as to output data read out from the parity cell array.

18 Claims, 14 Drawing Sheets

WRITE CIRCUIT

READ CIRCUIT (1)

PARITY BIT COMPUTING & COMPARISON CIRCUIT

RECOVERY CIRCUIT 01-04

OUTPUT CONTROL CIRCUIT 04 (1)

TIMING CHART (1)

TIMING CHART (2)

READ CIRCUIT (2)

OUTPUT CONTROL CIRCUIT 04 (2)

MEMORY CIRCUIT HAVING PARITY CELL ARRAY

BACKGROUND OF THE INVENTION

1. Field of the Invention

The present invention relates to a memory circuit having a parity cell array, and more particularly to a memory circuit capable of a test of a real cell array and a parity cell array.

The present invention also relates to a semiconductor memory which has a memory cell array for storing parity data of write data and has a Built-in Self Test (BIST) function.

2. Description of the Related Art

One-transistor type Dynamic RAM (DRAM) is in widespread use as low-cost, high capacity memory but requires a refresh operation on account of being volatile, even in a power ON state. On the other hand, where static RAM (SRAM) is concerned, although an increase in capacity comes at a high cost, such SRAM is capable of continually holding stored data in a power ON state, meaning that it is not necessary to control a refresh operation as is the case for DRAM.

Conventionally, SRAM, which does not necessitate refresh control, has been used in mobile telephones and mobile information terminals, and the like, but the change to Broadband and links with the Internet of recent years have resulted in a need to switch to high-capacity memory, and examplifierles of DRAM being used in place of conventional SRAM have been on the increase. As a result, a need has arisen to provide DRAM that does not require refresh control from outside.

DRAM without a refresh mode of the kind described above contains a refresh control circuit that performs a refresh operation according to a predetermined cycle without the provision of refresh commands from outside. Such a refresh control circuit performs control by generating a refresh request signal according to the predetermined cycle, supplying a refresh address counter value constituting a refresh address to a decoder, and sequentially refreshing internal memory with respect to this predetermined cycle. Here, when there is a conflict between a read command from outside and a refresh request generated internally, a refresh operation must be performed in response to the internal refresh request while the read request from outside is being received.

In order to make the above operation possible, the present applicant has developed a memory which is provided with a parity cell array in addition to a real cell array; which computes and stores to the parity cell array a parity bit from data written to the real cell array; and recovers, with respect to the parity bit, data which has not been read out as a result of prioritizing an internal refresh request generated at the time of a read request.

However, with the DRAM described above, when data of the real cell array is read, data of the real cell array may sometimes be partially corrected by a parity bit which is read out from a parity cell array. Consequently, there is the problem that it is not possible to suitably perform an operational test prior to shipment.

In other words, since a parity cell array is installed in order to recover data from a real cell array by means of a parity bit, during an operational test it is not possible to judge from data outputted to data input/output terminals whether or not read and write operations of the real cell array are normal. Furthermore, the data of the parity cell array is only utilized in internal data recovery, that is, a circuit for external readout is not provided. It is therefore not possible to also judge whether or not the parity cell array can be read or written to normally.

Such a problem is not limited to DRAM for which there is no refresh mode. There are also similar problems with memory configured to recover a defective bit, by means of internal circuitry, using a parity bit or other such error correction code ("ECC" hereinafter).

Further, the size of the wafer in which the semiconductor memory is formed tends to be large in order to reduce the manufacturing costs for semiconductor memory. As a result of making the wafer size large, the number of semiconductor memory chips formed on the wafer increases, as does the test time per wafer. Consequently, Built-in Self Test (BIST) technology, which involves the installation of a test circuit in the semiconductor memory and shortens the test time, has been developed.

In a Built-in Self Test, at the time of a test mode, the test circuit generates a test pattern (write address, write data). Then, in accordance with this test pattern, the test circuit writes data to memory cells, and then compares data read out from the memory cells with expected values to thereby confirm that the semiconductor memory is operating correctly. Then, the test pattern is supplied to nodes being close to external terminals in order to test the signal paths for address and data employed in a normal operation.

FIG. 19 shows an overview of a DRAM operating as an SRAM. In the figure, signal lines indicated by bold lines are formed in a plurality. The DRAM has an address buffer 110, a data input/output buffer 122, a parity generating circuit 124, a parity test circuit 142, a plurality of real cell arrays RCA, and a parity cell array PCA.

The real cell arrays RCA are each formed so as to correspond with data input/output terminals DQ. The parity cell array PCA stores parity data for data which is stored in the real cell arrays RCA. A refresh operation is executed in accordance with a refresh request outputted by a timer (not shown) contained in the DRAM.

The parity generating circuit 124 generates parity data for write data during a write operation, and writes such parity data to the parity cell array PCA. Further, write data supplied via the data input/output terminal DQ are written directly to the real cell arrays RCA.

Memory cell refresh operations are executed sequentially for each of the memory cell arrays RCA, PCA. When there is a conflict between a refresh operation and a write operation, these operations are executed sequentially starting with the operation request which is received first.

When a readout operation is requested while executing a refresh operation for any of the real cell arrays RCA, the parity test circuit 142 recovers data, which has been stored in the real cell array RCA undergoing a refresh operation, on the basis of data read out from a real cell array RCA for which a refresh operation has not been executed and from the parity cell array PCA.

When Built-in Self Test technology is adopted for DRAM having the above-described parity cell array PCA, it is desirable that, similarly to general DRAM, the test pattern (data) generated by the test circuit be supplied to a data input/output buffer 122. Meanwhile, a data bus line connected to the parity cell array PCA is connected with the data input/output buffer 122 via the parity generating circuit 124 or the parity test circuit 142. For this reason, with conventional Self Test technology, the test pattern generated by the test circuit cannot be directly supplied to the data bus line connected with the parity cell array PCA. Thus, it has not been possible to test DRAM having a parity cell array PCA by means of a Built-in Self Test.

SUMMARY OF THE INVENTION

It is accordingly an object of the present invention to provide, in a memory containing a parity cell array (or ECC cell array) and data recovery circuits therefor, a memory circuit whereby a real cell array and the parity cell array (or ECC cell array) can be suitably tested.

Further, it is another object of the present invention to provide, in a memory not having a refresh mode and which contains a parity cell array (or ECC cell array) and data recovery circuits therefor, a memory circuit whereby a real cell array and the parity cell array (or ECC cell array) can be suitably tested.

It is a further object of the present invention to implement a Built-in Self Test in a semiconductor memory having a memory cell array for storing parity data for data, to thereby reduce the test time.

It is another object of the present invention to prevent an increase in chip size by restricting the scale of the Built-in Self Test circuit to a minimum.

In order to achieve the above objects, a first aspect of the present invention is a memory circuit, having: a real cell array for storing data; a parity (or ECC) generating circuit for generating a parity bit (or ECC) from data of the real cell array; a parity cell array (or ECC cell array) for storing the parity bit (or ECC); a refresh control circuit, which generates an internal refresh request signal at a predetermined cycle, sequentially refreshes the real cell array in accordance with a refresh address, and, when an internal refresh request and a read request coincide, prioritizes a refresh operation for this real cell array; a data recovery section, which, in accordance with the parity bit (or ECC) read out from the parity cell array (or ECC cell array), recovers data read out from the real cell array for which the refresh operation has been prioritized; and an output circuit for outputting data from the real cell array, wherein the memory circuit has a test control circuit, which, at a first test mode, prohibits a refresh operation for the real cell array to thereby output data read out from the real cell array, and, at a second test mode, controls the output circuit so as to output data read out from the parity cell array (or ECC cell array).

According to the above first aspect, in a memory circuit not having a refresh mode, during a test, it is possible to carry out a real cell array data output and a parity cell array (or ECC cell array) data output separately.

In a preferred embodiment of the above first aspect, in response to the provision of a first test command, the test control circuit performs control in the first test mode, and, in response to a second test command different from the first test command, the test control circuit performs control in the second test mode. Thus, switching of a real cell array data output and a parity cell array (or ECC cell array) data output can be performed by means of different test commands.

In the preferred embodiment of the above first aspect, in response to the provision of a test command, the test control circuit enters a test mode and, in accordance with a state of an external signal which is not contained in an operation command at the time of the test mode, switches between the first test mode and second test mode. As a result, in a test mode which the test control circuit enters in accordance with a test command, the test control circuit is capable of switching between a real cell array data output and a parity cell array (or ECC cell array) data output in accordance with the external signal.

In order to achieve the above objects, a second aspect of the present invention is a memory circuit, having: a real cell array for storing data; a parity generating circuit (or ECC computing circuit) for generating a parity bit (or ECC) from data of the real cell array; a parity cell array (or ECC cell array) for storing the parity bit (or ECC); a data recovery section, which, in accordance with the parity bit (or ECC) read out from the parity cell array (or ECC cell array), recovers data read out from the real cell array; and an output circuit, which outputs data from the real cell array via the data recovery section, wherein the memory circuit has a test control circuit, which, at a test mode, prohibits the recovery of readout data by the data recovery section.

According to the above memory circuit, as a result of prohibiting the recovery of readout data by the data recovery section at the time of a test mode, real cell array data can be outputted to the outside as is, such that a test for the read and write operations of the real cell array can be carried out.

In order to achieve the above objects, a third aspect of the present invention is a memory circuit, having: a real cell array for storing data; a parity generating circuit (or ECC generating circuit) for generating a parity bit (or ECC) from data of the real cell array; a parity cell array (or ECC cell array) for storing the parity bit (or ECC); a data recovery section, which, in accordance with the parity bit (or ECC) read out from the parity cell array (or ECC cell array), recovers data read out from the real cell array; and an output circuit, which outputs data from the real cell array, wherein the memory circuit has a test control circuit, which, at a test mode, controls the output circuit so as to output data read out from the parity cell array (or ECC cell array).

According to the above memory circuit, in a test mode, because the output circuit for outputting data from a real cell array is controlled so as to output data from the parity cell array (or ECC cell array), data of the parity cell array (or ECC cell array) which is not read out to the outside in a normal operation can be outputted to the outside. It is therefore possible to conduct a test of the parity cell array (or ECC cell array) read and write operations.

In order to achieve the above objects, a fourth aspect of the present invention is a memory circuit, having: a real cell array for storing data; a parity generating circuit (or ECC generating circuit) for generating a parity bit (or ECC) from data of the real cell array; a parity cell array (or ECC cell array) for storing the parity bit (or ECC); a data recovery section, which, in accordance with the parity bit (or ECC) read out from the parity cell array (or ECC cell array), recovers data read out from the real cell array; and an output circuit, which outputs data from the real cell array via the data recovery section, wherein the memory circuit has a test control circuit, which, at a first test mode, prohibits the recovery of readout data in the data recovery section and, at a second test mode, controls the output circuit so as to output data read out from the parity cell array (or ECC cell array).

In order to achieve the above objects, according to a fifth aspect of the present invention, a semiconductor memory, comprises: a plurality of real cell arrays, which have memory cells for storing each of the write data supplied via a plurality of data terminals; a parity generating circuit for generating parity data for the write data; a pattern generating circuit, which, at a test mode, generates a test pattern and outputs the generated test pattern to a transmission path for the write data; a first switch circuit, which selects the parity data at a normal operation mode and selects a portion of the write data at the test mode; a parity cell array, which has memory cells for storing the parity data or a portion of the write data selected by the first switch circuit; a parity test circuit, which, at the normal operation mode, recovers the write data on the basis of real readout data read out from the real cell arrays and parity readout data read out from the parity cell array; and a test judgment circuit, which, at the test mode, judges a test result by comparing, with expected values, real readout data read out from the real cell arrays and parity readout data read out from the parity cell array.

In the above semiconductor memory, write data supplied via a plurality of data terminals are written to a plurality of real cell arrays having memory cells. Further, parity data for recovering write data stored in the real cell arrays are written to a parity cell array having memory cells.

At the time of a normal operation mode, the parity generating circuit generates write data parity data. The first switch circuit selects parity data generated by the parity generating circuit. The parity data are then written to the parity cell array.

The parity test circuit recovers write data on the basis of real readout data read out from the real cell arrays and parity readout data read out from the parity cell array. Consequently, at the time of a normal operation mode, when the output of correct data is not possible from any of the real cell arrays, corrected data can be read out through data recovery using the parity data.

Meanwhile, at the time of a test mode, the pattern generating circuit generates a test pattern and outputs the generated test pattern to a transmission path for the write data. The test pattern is written to the real cell arrays as write data. The first switch circuit selects a portion of the write data generated by the pattern generating circuit. In other words, at the time of a test mode, a portion of the write data generated by the pattern generating circuit instead of the parity data generated from the write data is written directly to the parity cell array.

The test judgment circuit receives real readout data read out from the real cell arrays and parity readout data read out from the parity cell array. The test judgment circuit judges a test result by comparing, with expected values, real readout data and parity readout data. That is, the test judgment circuit directly compares parity readout data from the parity cell array with expected values. Therefore, by employing a test circuit installed in a semiconductor memory, a test pattern can be written directly to a parity cell array to thereby permit a Built-in Self Test for the semiconductor memory by means of a direct readout.

Moreover, since it is possible to simultaneously compare real readout data and parity readout data with expected values by means of a test judgment circuit, the test time can be shortened. A shortening of the test time permits a reduction in the manufacturing costs for semiconductor memory.

In a preferred embodiment of the above fifth aspect of the invention, the memory cells of the real cell arrays each have a capacitor for storing write data as electrical charge. Refresh operations for rewriting data held in the memory cells are executed sequentially for each of the real cell arrays. The parity test circuit recovers the write data of the real cell arrays undergoing a refresh operation. In other words, this semiconductor memory is capable of executing a refresh operation without recognition by an external device. In this type of semiconductor memory, a Built-in Self Test is also implemented, which makes it possible to shorten the test time.

In the preferred embodiment of the above fifth aspect of the invention, the parity test circuit detects an error in the real readout data read out from the real cell arrays and corrects this error to produce correct data. In other words, this semiconductor memory has an error detection and correction function. In this type of semiconductor memory, a Built-in Self Test is also implemented, which makes it possible to shorten the test time.

In the preferred embodiment of the above fifth aspect of the invention, the parity cell array has the same storage capacity and has the same structure as the real cell arrays. Consequently, when the semiconductor memory is designed, it is not necessary to design both a real cell array and a parity cell array. As a result, it is possible to shorten the time required for the layout design in particular.

In the preferred embodiment of the above fifth aspect of the invention, a second switch circuit outputs, at the time of a normal operation mode, write data to the real cell arrays respectively. The second switch circuit outputs, at the time of a test mode, a portion of write data selected by the first switch circuit to the real cell arrays as common write data. In other words, at the time of a test mode, a write data compression test, in which common write data are written to a plurality of cell arrays, is implemented. Thus, the bit count of the test pattern can be reduced and the scale of the pattern generating circuit can be reduced. As a result, it is possible to reduce the semiconductor memory chip size.

DESCRIPTION OF THE PREFERRED EMBODIMENTS

Figure 1:
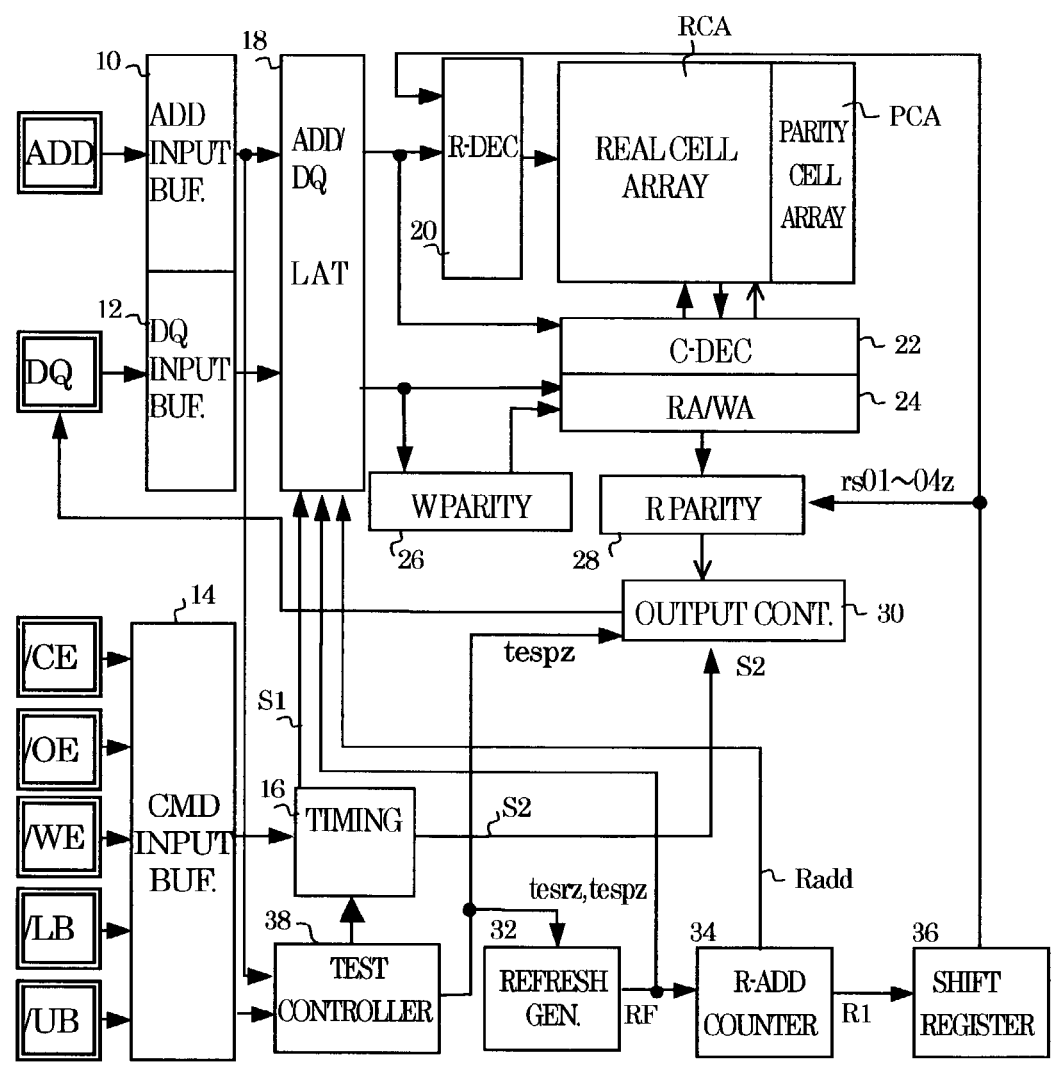
FIG. 1 shows the overall configuration of the memory circuit of the present embodiment.

The embodiments of the present invention will be described hereinbelow referring to the drawings. However, the scope of protection of the present invention is not limited to or by the following embodiments, but rather is intended to cover the inventions described in the patent claims and any equivalents thereof.

First Embodiment

FIG. 1 shows the overall configuration of the memory circuit of the first embodiment. This memory circuit has an ordinary real cell array RCA for storing data and has a parity cell array PCA for storing a parity bit for data written to this real cell array. The cell arrays each contain (not shown) a plurality of word lines, a plurality of bit lines, and 1-transistor/1-capacitor cells positioned at the points of intersection between these word lines and bit lines.

A parity bit stored in the parity cell array PCA is a code which is generated by computing data written to the real cell array, i.e. a code that permits the recovery of errors in data which are read out from the real cell array subsequently. Consequently, in that sense, the parity cell array can be said to be an ECC cell array which stores an error correction code (ECC). That is, by storing an ECC generated by means of logic more complex than that for a parity bit, even in the event of a partial error in data read out from the real cell array, this error can be corrected. However, the embodiment hereinbelow will be described by way of examplifierle of a parity bit and a parity cell array.

The memory circuit in FIG. 1 has an address input buffer 10 for inputting address signals supplied to a plurality of address terminals ADD; an input buffer 12 for input data supplied to a plurality of input/output terminals DQ; a command input buffer 14 for a plurality of command terminals /CE, /OE, /WE, /LB (Lower Byte), /UB (Upper Byte); and a timing generating circuit 16, which decodes input commands to thereby generate timing signals for internal control. In response to a latch control signal Si generated by the timing generating circuit 16, a latch circuit 18 latches addresses and data which are inputted to the address input buffer 10 and the data input buffer 12 respectively.

Latched addresses are decoded by the row decoder 20 and the column decoder 22 such that the selection of word lines and bit lines can be performed. Further, latched input data are supplied to a write amplifier 24 and selected bit lines are driven such that input data are written to the real cell array RCA. Also, data read out from the real cell array RCA are latched by a read amplifier 24, and, in response to an output control signal S2 which is generated by the timing generating circuit 16, the output control circuit 30 outputs this read data to input/output terminals DQ.

The first memory circuit is DRAM which does not have a refresh mode and therefore contains a refresh control circuit. The refresh control circuit is constituted from a refresh generating circuit 32, a refresh address counter 34, and a shift register 36. The refresh generating circuit 32 generates a refresh request signal RF with respect to a predetermined cycle. The refresh address counter 34 increments a counter value in response to the refresh request signal RF. Further, a corresponding refresh address Radd is latched by the latch circuit 18 in response to the refresh request signal RF. Also, in correspondence with the refresh address Radd, the shift register circuit 36 outputs real cell array RCA memory block select signals rs01z to rs04z. When the refresh request signal RF is generated, one memory block select signal is controlled to assume an H level. When the refresh request signal RF is not outputted, all of the memory block select signals are controlled to an L level.

In the present embodiment, the real cell array RCA is constituted from four memory blocks, as described hereinafter. In response to an internally generated refresh request signal RF, in a memory block selected by the shift register circuit 36, word lines selected in accordance with a refresh address Radd are driven to thereby perform a refresh operation. In other words, when a refresh operation in one memory block ends, processing moves to the next memory block, that is, memory blocks which are the subject of a refresh operation are selected in rotation by the shift register 36 serially.

The refresh generating circuit 32 generates a refresh request signal RF independently of commands from outside. It is therefore predicted to cause a conflict between a read cycle from an external memory controller and an internal refresh cycle. In such a case, it is then also necessary to execute an internal refresh cycle while a read cycle from outside is being executed. Here, a refresh operation is performed with respect to memory blocks which are the subject of a refresh operation by driving word lines in accordance with a refresh address Radd, and a readout operation is carried out with respect to memory blocks other than the memory blocks which are the subject of a refresh operation by driving word lines in accordance with an address ADD from outside.

In the case described above, read data cannot be obtained from memory blocks which are the subject of a refresh operation. Therefore, this memory circuit comprises a parity cell array PCA and is configured so as to be capable of recovering data from memory blocks which are the subject of a refresh operation. In other words, a parity bit of write data for four memory blocks is generated by a write parity computing circuit 26 and written to the parity cell array PCA. Then, during readout, data of memory blocks which are the subject of a refresh operation are recovered by means of read data from four memory blocks and a parity bit from the parity cell array. Specifically, a read parity computing circuit 28 generates a parity bit for read data from four memory blocks, and read data which are the subject of a refresh operation are recovered (corrected) depending on the result of a comparison of this parity bit and a parity bit read out from the parity cell array.

The memory circuit in FIG. 1 further comprises a test signal generating circuit 38 for conducting an operation test of the real cell array RCA and the parity cell array PCA. In response to commands inputted to command terminals and address terminals, the test signal generating circuit 38 enters a predetermined test mode and supplies a test signal to internal circuitry. Details will be provided hereinafter.

Figure 2:
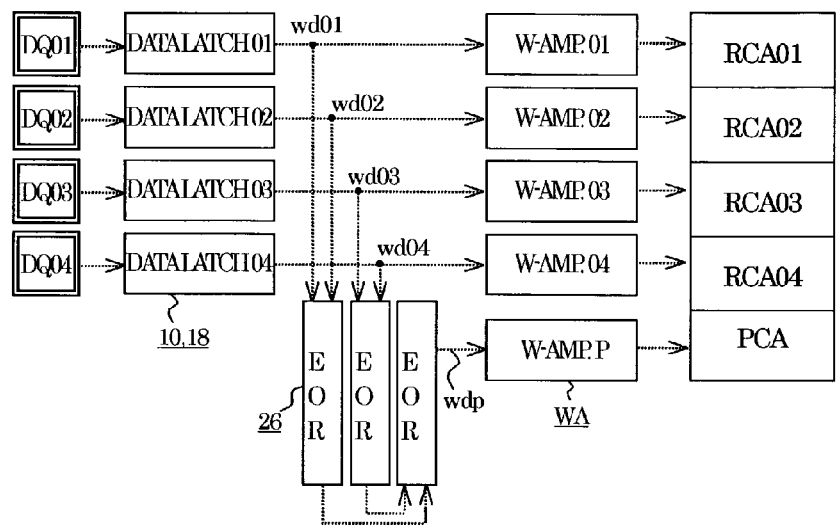
FIG. 2 shows a write circuit of the present embodiment.

FIG. 2 shows a write circuit of the present embodiment. Cell arrays are provided at the right-hand portion that include, a real cell array constituted from four memory blocks RCA01 to RCA04, and a parity cell array PCA. A write amplifier circuit WA is provided for each of the cell arrays. In addition, four input/output terminals DQ01 to DQ04, and data latch circuits 10, 18 also serving as input buffers, are provided in correspondence with the four memory blocks.

Input data latched by the four data latch circuits are supplied to the write amplifier circuits WA, which correspond to the four data latch circuits respectively, and are supplied to the write parity computing circuit 26. The write parity computing circuit 26 is constituted from three EOR circuits whereby a write parity bit wdp is generated by computing the EOR with EOR data of inputted write data wd01, wd02 and EOR data of write data wd03, wd04. The write parity bit wdp is supplied to the write amplifier circuit WA that corresponds to the parity cell array PCA. The supplied write data and parity bit of the above write amplifier circuit are written to the real cell array RCA and the parity cell array PCA respectively.

If there are an even number of the data "1" or data "0" of the 4-bit write data wd01 to wd04, the parity bit is 0, and for an odd number, the parity bit is 1.

Figure 3:
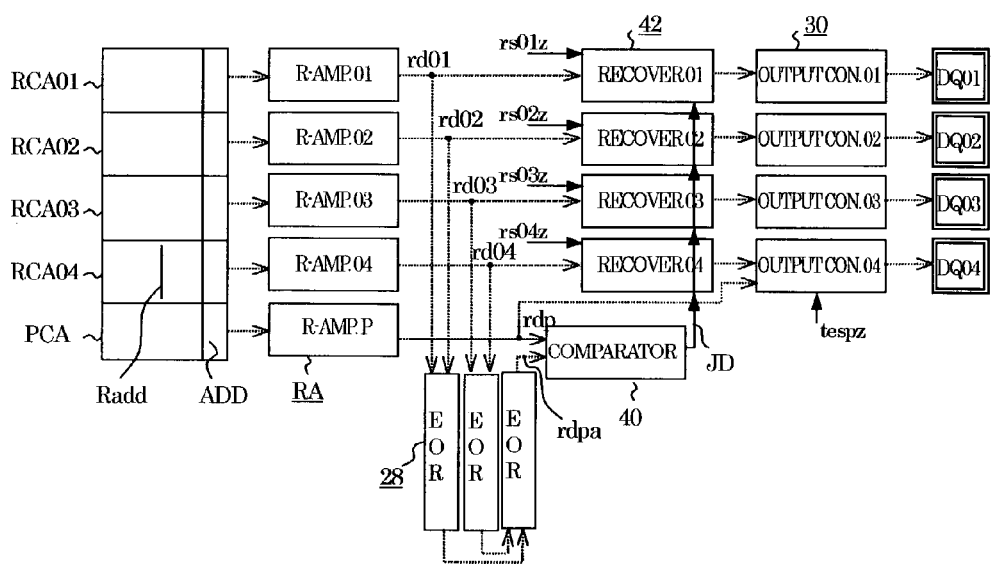
FIG. 3 shows a read circuit of the present embodiment.

FIG. 3 shows a read circuit of the present embodiment. The four memory blocks RCA01 to RCA04 of the real cell array and the parity cell array PCA are each provided with a read amplifier circuit RA. Four read data rd01 to rd04 from the memory blocks are supplied to recovery circuits 42 respectively and supplied to the read parity computing circuit 28. This parity computing circuit 28 is constituted from three EOR circuits in the same way as the write parity computing circuit 26. A parity bit rdpa generated by the parity computing circuit 28 and a parity bit rdp read out from the parity cell array are compared by a comparison circuit 40, whereby a judgment signal JD indicating a match or a non-match is generated.

Select signals rs01z to rs04z, which are for selecting memory blocks which are the subject of a refresh operation, and a judgment signal JD are supplied to the recovery circuits 42 to which the read data rd01 to rd04 are supplied, respectively. Further, when, of the select signals rs01z to rs04z, select signals for blocks which are the subject of a refresh operation assume an H level, the corresponding recovery circuits recover (correct) the read data rd01 to rd04 in accordance with the judgment signal JD.

Let us assume, for instance, that write data DQ01 to DQ04 are "0110". A parity bit "0" is then generated during writing and written to the parity cell array. Let us assume that, thereafter, while readout is being performed, a refresh operation with respect to the real cell memory block RCA04 coincides with the readout operation. In other words, as shown in FIG. 3, with respect to memory blocks RCA01, RCA02, RCA03 and the parity cell array PCA, word lines corresponding with an external address ADD are driven, and, in the memory block RCA04, a word line corresponding with a refresh address Radd is driven. In other words, the select signal rs04z alone assumes an H level, and the remaining select signals all assume an L level.

Hence, the read data rd04 is data accompanying a refresh operation and not data in accordance with external read control. If the read data rd04 is "0", "0110" is inputted to the parity computing circuit 28, and the parity bit is "0" which matches a parity bit "0" read out from the parity cell array PCA, such that the judgment signal JD then assumes an L level (match). On the other hand, if the read data rd04 is "1", "0111" is inputted to the parity computing circuit 28, and the parity bit is "1" which does not match the parity bit "0" read out from the parity cell array PCA, such that the judgment signal JD then assumes an H level (non-match).

The recovery circuit 04 for which the select signal rs04z=H recovers or corrects read data rd04 in accordance with this judgment signal JD. In other words, the recovery circuit 04 outputs read data rd04 as is if the judgment signal JD is at an L level (match) and outputs read data rd04 after inverting same if the judgment signal JD is at an H level (non-match). Thus, if a parity bit is used and the position of the defective bit is known, recovery of the original data is made possible.

If, in place of a parity bit, an ECC is stored which is sought by means of more complex computation, even if the position of the defective bit is not known, degradation of read data from the real cell array can be recovered. In such a case, a select signal need not be supplied to the recovery circuits.

Figure 4:
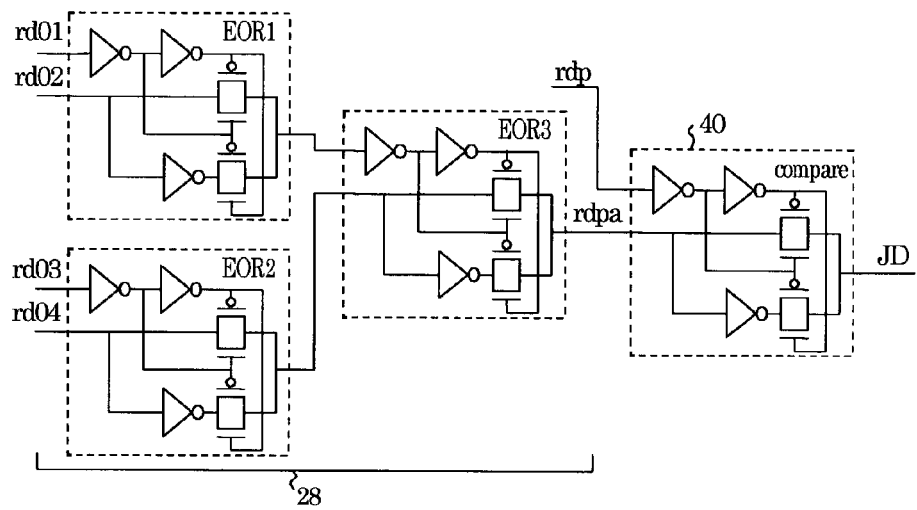
FIG. 4 is a circuit diagram showing a parity bit computing circuit and a comparison circuit.

FIG. 4 is a circuit diagram showing a parity bit computing circuit and a comparison circuit. The parity bit computing circuit 28 is constituted from an EOR circuit EOR1 for seeking the exclusive OR of read data rd01, rd02, an EOR circuit EOR2 for seeking the exclusive OR of read data rd03, rd04, and an EOR circuit EOR3 for seeking the exclusive OR of the outputs of the aforementioned EOR circuits EOR1, EOR2. Each of the EOR circuits is formed by three inverters and two transfer gates. A description of the operation of these EOR circuits is omitted here since such operation is well known. The comparison circuit 40 is an EOR circuit which seeks the exclusive OR of the parity bit rdp read out from the parity cell array and the parity bit rdpa generated by the parity bit computing circuit 28, and has the same circuit constitution as the other EOR circuits.

Figure 5:
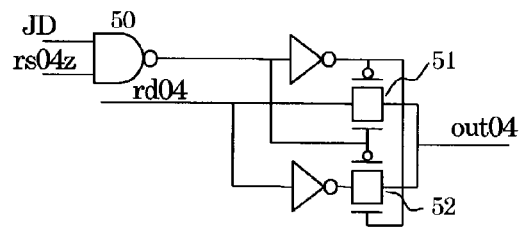
FIG. 5 is a circuit diagram showing a recovery circuit.

FIG. 5 is a circuit diagram showing a recovery circuit. The four recovery circuits in FIG. 3 all have the same circuit constitution and FIG. 5 shows the fourth recovery circuit of these four recovery circuits. A judgment signal JD is inputted in accordance with the select signal rs04z. In other words, when the select signal rs04z is at an H level and the judgment signal JD passes through the NAND gate 50, either one of the two transfer gates 51, 52 conducts in accordance with the judgment signal JD, such that non-inverted data or inverted data of the read data rd04 is outputted as an output out04. That is, if the judgment signal JD=H level (parity bit non-match), the output of the NAND gate 50 assumes an L level, and the transfer gate 52 conducts, such that the inverted data of the read data rd04 is outputted. On the other hand, if the judgment signal JD=L level (parity bit match) non-inverted data of the read data rd04 is outputted.

Operation Test

The constitution and operation of the DRAM circuit not having a refresh mode has been described hereinabove. In such memory, in normal operation, if a refresh operation is not being performed, data of a real cell array is supplied to external terminals DQ without being recovered by the recovery circuits, that is, this data can be read out as is. However, when a refresh operation is being performed, data of the real cell array is recovered by the recovery circuits, meaning that this data cannot be read out as is. Secondly, data of the parity cell array is only supplied to the recovery circuits and cannot be read out from the external terminals DQ. Thus, in the memory circuit not having a refresh mode described above, in order to suitably conduct an operation test of the real cell array and the parity cell array, a special test control circuit and a test mode are required.

In the present embodiment, at the time of a test for write and read operations with respect to cell arrays, an internal refresh operation is prohibited such that data of the real cell array is outputted to the outside as is. Furthermore, part of an output control circuit is controlled to thereby permit an output of data of the parity cell array.

Figure 7:
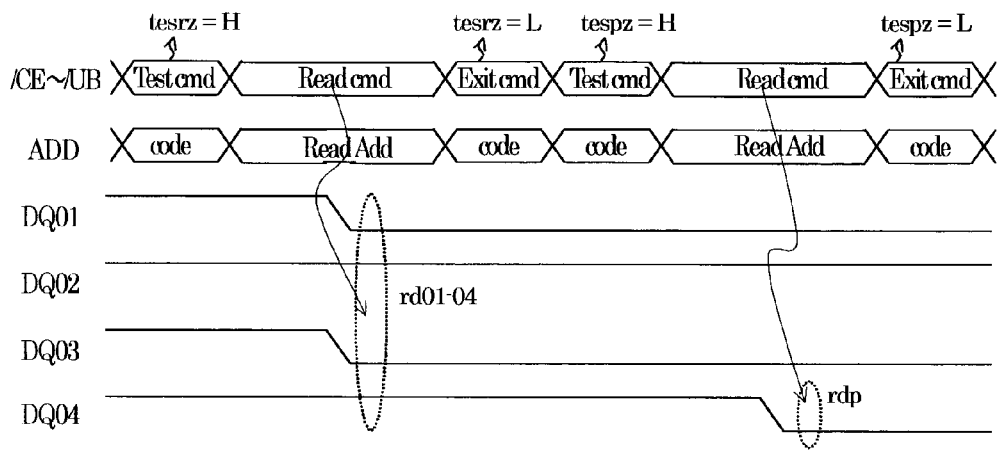
FIG. 7 is a first timing chart for a test mode of the present embodiment.

FIG. 7 is a first timing chart for a test mode of the present embodiment. Operation during a test will be described, referring to FIG. 1. When test commands and test codes are inputted to the command terminals/CE to /UB and to the address terminals ADD respectively, the test control circuit 38 decodes these test commands and test codes and detects a first test mode. Accordingly, the test control circuit 38 sets the first test signal tesrz to an H level, and prohibits an output of a refresh request signal RF by the refresh generating circuit 32.

The generation of a refresh request signal RF causes the latch circuit 18 to latch both an address ADD from outside and a refresh address Radd, and the row decoder 20 is made to decode both addresses, whereupon a refresh operation is performed with respect to memory blocks selected in accordance with the select signals rs01z to rs04z. However, in the above first test mode, generation of an internal refresh request signal RF is prohibited, meaning that none of the memory blocks is the subject of a refresh operation.

Furthermore, an internal refresh request signal RF is not outputted in the first test mode. Further, all the select signals rs01z to rs04z assume an L level whereby the parity bit recovery function of the recovery circuits is suspended.

When the first test mode commences, a read command for a readout operation test is supplied from an external tester device, along with a readout address. As a result, the row decoder 20 selects and drives word lines in accordance with an external address, with respect to all the memory blocks, such that read data of each memory block is outputted from the input/output terminals DQ01 to DQ04. Here, as described hereinabove, an internal refresh operation is prohibited, such that the select signals rs01z to rs04z then remain at an L level and the recovery circuits 42 do not perform recovery by means of a parity bit.

When the first test mode ends, a mode exit command and a code is supplied from outside, the first test mode is canceled, and the first test signal tesrz returns to an L level.

Next, a test command and a test code are inputted to the command terminals/CE to /UB and to the address terminals ADD respectively, the test control circuit 38 decodes this test command and test code to thereby detect the second test mode. Accordingly, the test control circuit 38 sets the second test signal tespz to an H level, prohibits an output of a refresh request signal RF by the refresh generating circuit 32, controls an output control circuit 30 corresponding with the external terminal DQ04 to thereby render a state in which the data of the parity cell array can be outputted.

Figure 6:
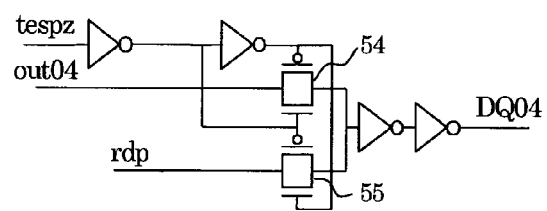
FIG. 6 is a circuit diagram of an output control circuit capable of outputting data of a parity cell array.

As shown in FIG. 3, the second test signal tespz is supplied to one output control circuit. FIG. 6 is a circuit diagram of an output control circuit capable of outputting data of the parity cell array. This output circuit is equipped with transfer gates 54, 55 for the selection of either the read data out04 from the real cell array or the read data rdp from the parity cell array in accordance with the second test signal tespz. When the second test signal tespz assumes an H level in the second test mode, the transfer gate 55 conducts such that the read data rdp from the parity cell array is outputted from the output terminal DQ04. During operation other than during the second test mode, the second test signal tespz assumes an L level and the transfer gate 54 conducts such that read data out04 from the real cell array is outputted to the output terminal DQ04.

Therefore, with the output control circuit in FIG. 6, during normal operation, read data of the real cell array is recovered by recovery circuits if a refresh operation is underway, but outputted to the output terminal DQ04 without being recovered if a refresh operation is not in progress. During a test operation, in a first test mode, read data of the real cell array is outputted to the output terminal DQ04 without being recovered by the recovery circuits. Further, in a second test mode, a parity bit of the parity cell array is outputted to the output terminal DQ04.

Returning now to FIG. 7, when the second test mode ends, a mode exit command and code are supplied from outside such that the second test mode is canceled and the second test signal tespz then returns to an L level.

Figure 8:
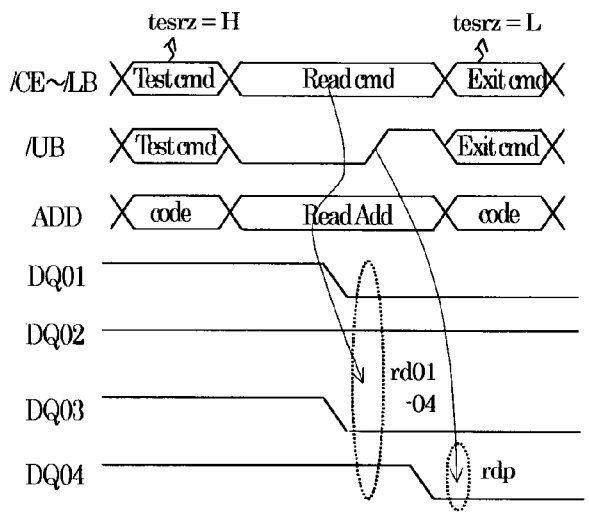
FIG. 8 is a second timing chart for a test mode of the present embodiment.

FIG. 8 is a second timing chart for a test mode of the present embodiment. In this test mode, a test mode commences in response to a test command from outside, and, switching between the first test mode and the second test mode can be effected using the external terminal/UB which does not exert an influence in the test operation. In other words, by toggling the external terminal/UB, switching of the first test mode and the second test mode is possible. There is therefore no need to enter or perform ejection from the first and second test modes by means of commands, as shown by the example in FIG. 7.

Figure 9:
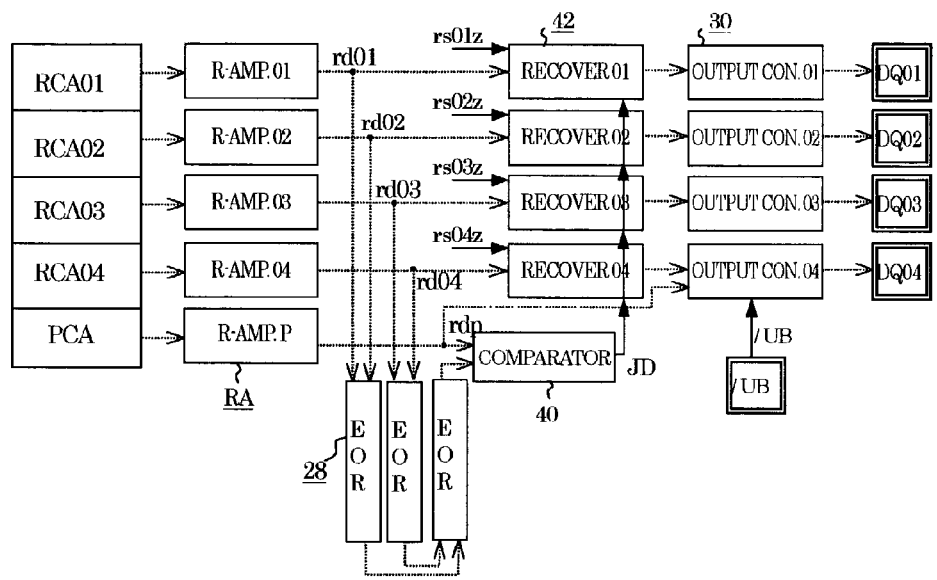
FIG. 9 shows a read circuit that corresponds to the second timing chart.
Figure 10:
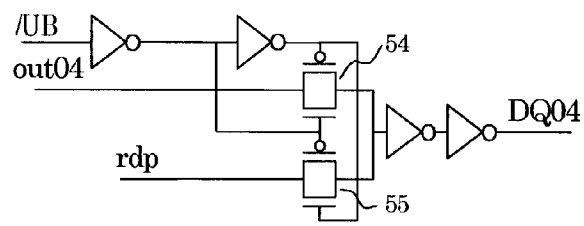
FIG. 10 shows an output control circuit that corresponds to the second timing chart.

FIG. 9 shows a read circuit that corresponds to the second timing chart and FIG. 10 shows an output control circuit. In the circuit of FIG. 9, differently from that in FIG. 3, a signal/UB from the command terminal/UB is supplied to the output control circuit 30 corresponding with output terminal DQ04. With the exception of this fact, the circuit constitution is the same. Also, unlike the circuit in FIG. 6, the output circuit in FIG. 10 is supplied with a signal/UB from the command terminal/UB such that read data out04 or a parity bit rdp is selected.

Returning now to FIG. 8 to describe the operation, when a test entry command and a test entry code are inputted to the command terminals/CE to /LB, /UB and to the address terminals ADD respectively, the test control circuit 38 sets the first test signal tesrz to an H level, thereby prohibiting an internal refresh operation. Accordingly, all the select signals rs01z to rs04z assume an L level and the parity bit recovery function of the recovery circuits is also suspended. Thereafter, a read command from outside for a read test is supplied to the command terminals/CE to /LB and a read address is supplied to the address terminals ADD.

At such time, the output control circuit in FIG. 10 selects real cell array read data by controlling the upper byte terminal/UB to assume an L level. Thus, read data, which is read out from each of the memory blocks RCA01 to RCA04 in accordance with the read address is outputted to the output terminals DQ01 to DQ04 as is. Further, during the same read operation cycle in the same test mode, by controlling the upper byte terminal/UB to assume an H level, the output control circuit in FIG. 10 selects a parity bit rdp of a parity cell array and outputs same to the output terminal DQ04. Therefore, in a common test mode and in a common read operation cycle, the readout of the data in the real cell array and the readout of data in the parity cell array can be performed separately. The test time can thus be made markedly shorter than the test of the first timing chart.

Read operation cycles performed using a read command in each test mode has been explained in the test timing charts of FIGS. 7 and 8. Further, a write command is introduced before a read command to thus permit a check of a read operation after a write operation.

Second Embodiment

Next, a second embodiment will be described. In the figure, signal lines indicated by bold lines are formed in a plurality. Further, some of the blocks connected by bold lines are constituted by a plurality of circuits. Reference symbols which are the same as the terminal names are used for the signals supplied via the external terminals, and reference symbols which are the same as the signal names are used for signal lines whereby signals are transferred.

Figure 11:
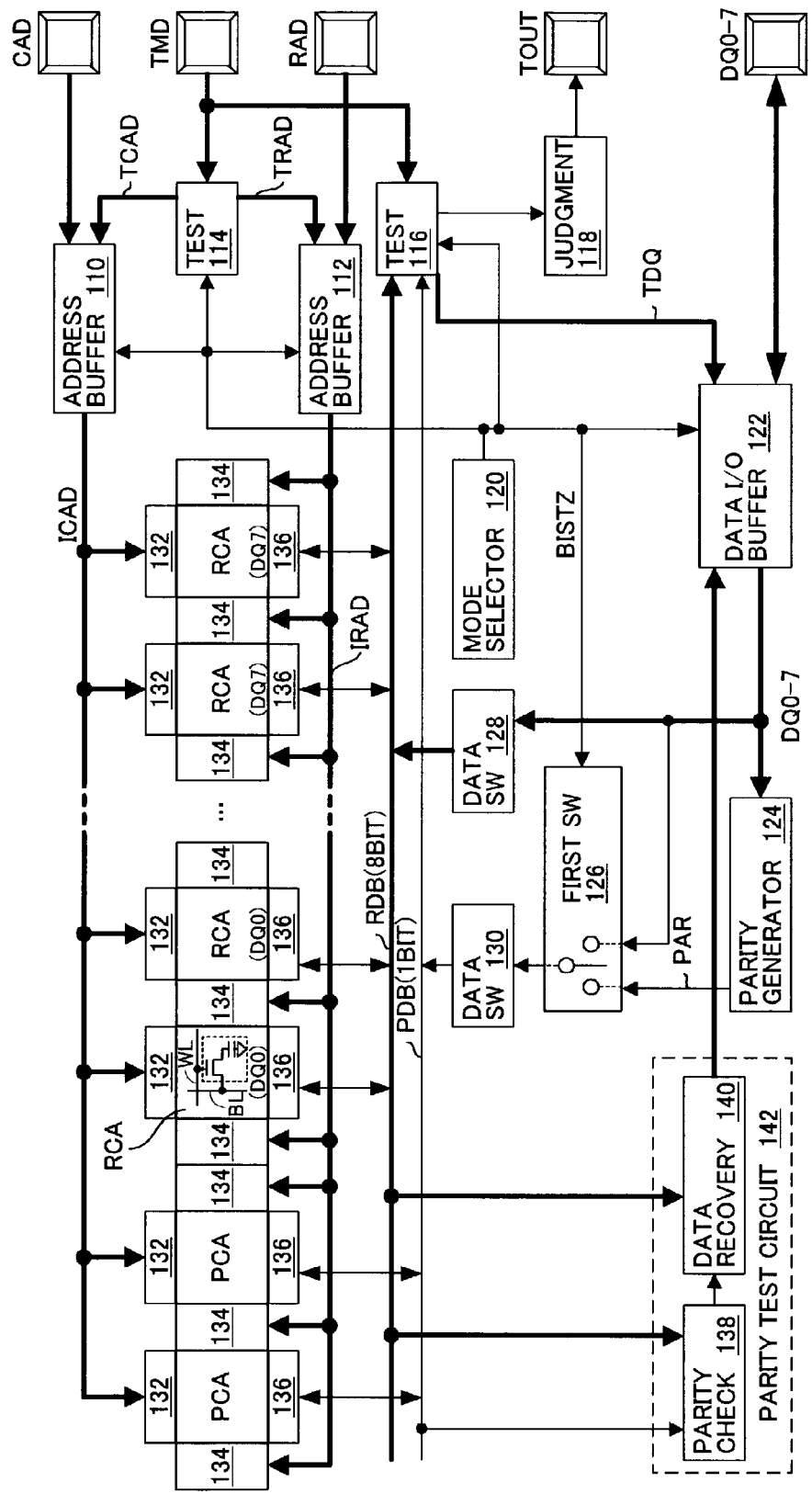
FIG. 11 is a block diagram showing a second embodiment of the semiconductor memory of the present invention.

FIG. 11 shows a second embodiment of the semiconductor memory of the present invention. This semiconductor memory is formed as DRAM using a CMOS process on a silicon substrate. The DRAM has a function to execute a memory cell refresh operation without external recognition. Here, a refresh operation is one in which data held in memory cells is rewritten.

Further, the specifications of the external terminals of the DRAM and specifications thereof for signal input/output timing are made to match those for SRAM. In other words, this DRAM is pseudo SRAM that operates as SRAM. Moreover, the DRAM contains a Built-in Self Test (BIST) function so as to be capable of executing a test of the functions of the internal circuitry without receiving a test pattern from outside the chip.

The DRAM has address buffers 110, 112, test circuits 114, 116, a judgment circuit 118, a mode select circuit 120, a data input/output buffer 122, a parity generating circuit 124, a first switch circuit 126, data switches 128, 130, sixteen real cell arrays RCA, two parity cell arrays PCA, row decoders 132, column decoders 134, sense amplifiers 136, a parity check circuit 138 and a data recovery circuit 140.

Upon receiving a test command via external terminals, the DRAM proceeds from a normal operation mode to a test mode. The mode select circuit 120 outputs a low level test mode signal BISTZ in a normal operation mode and a high level test mode signal BISTZ in a test mode. Further, the test circuits 114, 116 and the judgment circuit 118 operate during a test mode.

When the test mode signal BISTZ is at a low level (normal operation mode), the address buffer 110 outputs a column address signal CAD supplied from an address terminal CAD as an internal column address signal ICAD. When the test mode signal BISTZ is at a high level (test mode), the address buffer 110 outputs a test column address signal TCAD supplied from the test circuit 114 as an internal column address signal ICAD.

When the test mode signal BISTZ is at a low level (normal operation mode), the address buffer 112 outputs a row address signal RAD supplied from an address terminal RAD as an internal row address signal IRAD. When the test mode signal BISTZ is at a high level (test mode), the address buffer 112 outputs a test row address signal TRAD supplied from a test circuit 114 as an internal row address signal IRAD.

When the test mode signal BISTZ is at a high level (test mode), the test circuit 114 operates in accordance with a combination of a test signal TMD supplied via the test terminal TMD and serially outputs a test column address signal TCAD and a test row address signal TRAD (test pattern). The test signal TMD is a signal for selecting any of a plurality of test patterns which can be generated by the test circuit 114.

When the test mode signal BISTZ is at a high level (test mode), the test circuit 116 operates in accordance with a combination of a test signal TMD supplied via the test terminal TMD and serially outputs an 8-bit test data signal TDQ (test pattern) to a data input/output buffer 22. In other words, at the time of a test mode, the test circuit 116 operates as a pattern generating circuit which generates a test pattern and outputs the generated test pattern to a write data transmission path.

In addition, the test circuit 116 simultaneously compares readout data transferred via a real data bus line RDB (real readout data) and readout data transferred via a parity data bus line PDB (parity readout data) with expected values, and outputs the comparison results to the judgment circuit 118. The test circuit 116 receives the readout data via the real data bus line RDB and the parity data bus line PDB respectively, and is therefore capable of receiving such readout data simultaneously and comparing same with expected values. Consequently, the test time can be shortened.

The judgment circuit 118 serially receives comparison results from the test circuit 116, judges test results according to a plurality of comparison results, and then outputs a judgment result to a test output terminal TOUT. At the time of a test mode, the test circuit 116 and the judgment circuit 118 operate as a test judgment circuit which judges test results by comparing, with expected values, real readout data read out from the real cell arrays RCA and parity readout data read out from parity cell arrays PCA.

The mode select circuit 120 outputs a high level test mode signal BISTZ in a test mode and outputs a low level test mode signal BISTZ in a normal operation mode for executing write operations and readout operations.

When the test mode signal BISTZ is at a low level (normal operation mode), the data input/output buffer 122 outputs an 8-bit data signal DQ (write data), as supplied from data terminals DQ, to the parity generating circuit 124 and a first switch circuit 126, and outputs an 8-bit data signal DQ (readout data), which is supplied from the data recovery circuit 140, to the data terminals DQ. Also, when the test mode signal BISTZ is at a high level (test mode), the data input/output buffer 122 outputs an 8-bit test data signal TDQ (test pattern), as supplied from the test circuit 116, to the parity generating circuit 124 and the first switch circuit 126.

The parity generating circuit 124 generates parity data PAR for every four bits of the 8-bit data signal DQ (or test data signal TDQ) supplied from data input/output buffer 122 and outputs generated parity data PAR to the first switch circuit 126.

When the test mode signal BISTZ is at a low level (normal operation mode), the first switch circuit 126 selects parity data PAR and outputs same to the data switch 130. When the test mode signal BISTZ is at a high level (test mode), the first switch circuit 126 selects the least significant bit of the 8-bit data signal DQ and outputs this bit to the data switch 130. In other words, at the time of a test mode, a portion of the data signal DQ generated by the test circuit 116 is used, not only as test data for the real cell arrays RCA, but also as test data for the parity cell arrays PCA.

The data switch 128 is turned ON at the time of a write operation such that data signals DQ0 to DQ7, as supplied from the data input/output buffer 122, are transferred to the real data bus line RDB. The data switch 130 is turned ON at the time of a write operation such that parity data, which is supplied from the first switch circuit 126, or the lower two bits of the data signals DQ0 to DQ7, are transferred to the parity data bus line PDB. Further, by means of the first switch circuit 126, the test data generated by the test circuit 116 is written directly to parity cell arrays PCA via the parity data bus line PDB.

Although not especially illustrated, the real cell arrays RCA and the parity cell arrays PCA have, similarly to ordinary DRAM: a plurality of memory cells which each comprise a transfer transistor and a capacitor; a word line WL, which is connected to the gate of the transfer transistor of each memory cell; and a bit line BL, which is connected to a data input/output node of the transfer transistors. Further, write data supplied from the data terminals DQ are stored in the capacitors as electrical charge.

Two real cell arrays RCA are assigned to each bit of a data signal DQ. Two real cell arrays RCA corresponding with the same bit of the data signal DQ are discriminated by means of the most significant bit of a row address signal RAD. That is, two real cell arrays RCA which correspond to a same bit data signal DQ do not operate simultaneously. Refresh operations for the real cell arrays RCA are executed sequentially for the pair of real cell arrays RCA to which the same bit data signal DQ is written.

Similarly, the two parity cell arrays PCA are discriminated by the most significant bit of the row address signal RAD. That is, the parity cell array PCA on the left in the figure stores parity data PAR for the real cell arrays RCA on the left in the figure, of the real cell arrays RCA which correspond with a data signal DQ. The parity cell array PCA on the right in the figure stores parity data PAR for the real cell arrays RCA on the right in the figure, of the real cell arrays RCA which correspond with the data signal DQ. Refresh operations for the parity cell arrays PCA are also executed simultaneously with respect to two real cell arrays RCA. The parity cell arrays PCA have the same storage capacity as the real cell arrays RCA and are formed using the same layout data. Since it is not necessary to newly design the layout of the parity cell arrays PCA, the time required for the layout design can be shortened.

The column decoders 132 decode an internal column address signal ICAD to thereby select a column switch for a cell array RCA (or PCA). As a result of a column switch being ON, a bit line BL is connected to the data bus line RDB (or PDB).

The row decoders 134 decode an internal row address signal IRAD to thereby select word lines WL of the memory cell arrays RCA (or PCA). A row decoder 134 disposed between the parity cell arrays PCA is shared by the cell arrays PCA which are on either side thereof. Similarly, a row decoder 134, which is disposed between two real cell arrays RCA which correspond to a same bit data signal DQ, is shared by these cell arrays RCA.

The sense amplifiers 136 amplifierlify the data signals DQ which are inputted to and outputted from the memory cells and the amplified data signals DQ are outputted to the real data bus line RDB (or the parity data bus line PDB).

The parity check circuit 138 computes the exclusive OR of real readout data read out from the real cell arrays RCA to the real data bus line RDB and parity readout data read out from the parity cell arrays PCA to the parity data bus line PDB, and outputs the computation result to the data recovery circuit 140.

The data recovery circuit 140 receives the real readout data, which are read out from the real cell arrays RCA to the real data bus line RDB, and the output of the parity check circuit 138, and recovers the readout data (write data written to the real cell arrays RCA). The recovered readout data are transferred to the data terminals DQ via the data input/output buffer 122.

At the time of a normal operation mode (during a readout operation), the parity check circuit 138 and the data playback circuit 140 operate as a parity test circuit 142 which recovers write data on the basis of the real readout data read out from the real cell arrays RCA and parity readout data read out from the parity cell arrays PCA.

Figure 12:
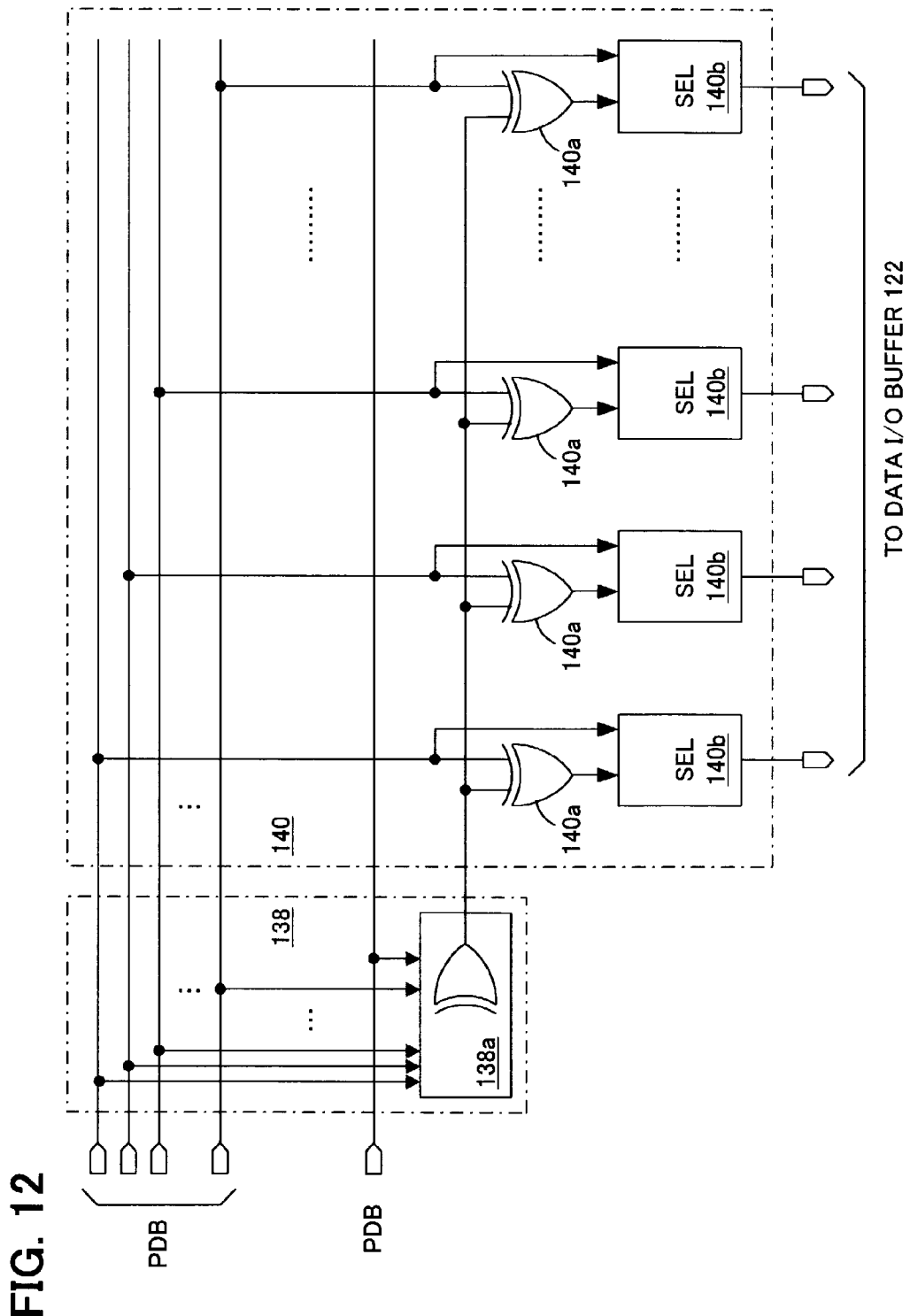
FIG. 12 is a circuit diagram showing details of the parity test circuit in FIG. 11.

FIG. 12 shows details of the parity test circuit 142 shown in FIG. 11.

The parity check circuit 138 of the parity test circuit 142 has an EOR circuit 138a which computes the exclusive OR of real readout data read out via an 8-bit real data bus line RDB and parity readout data read out via the 1-bit parity data bus line PDB.

The data recovery circuit 140 of the parity test circuit 142 has EOR circuits 140a, which are each provided in correspondence with the 8-bit real data bus line RDB, and has selectors 140b. Each of the EOR circuits 140a computes the exclusive OR of the output of the EOR circuit 138a and real readout data. The selectors 140b select the real readout data or the output of the EOR circuits 140a to output the selected data to the data input/output buffer 122 as recovered data. The selectors 140b select the outputs of the EOR circuits 140a when a corresponding real cell array RCA is undergoing a refresh operation.

Figure 13:
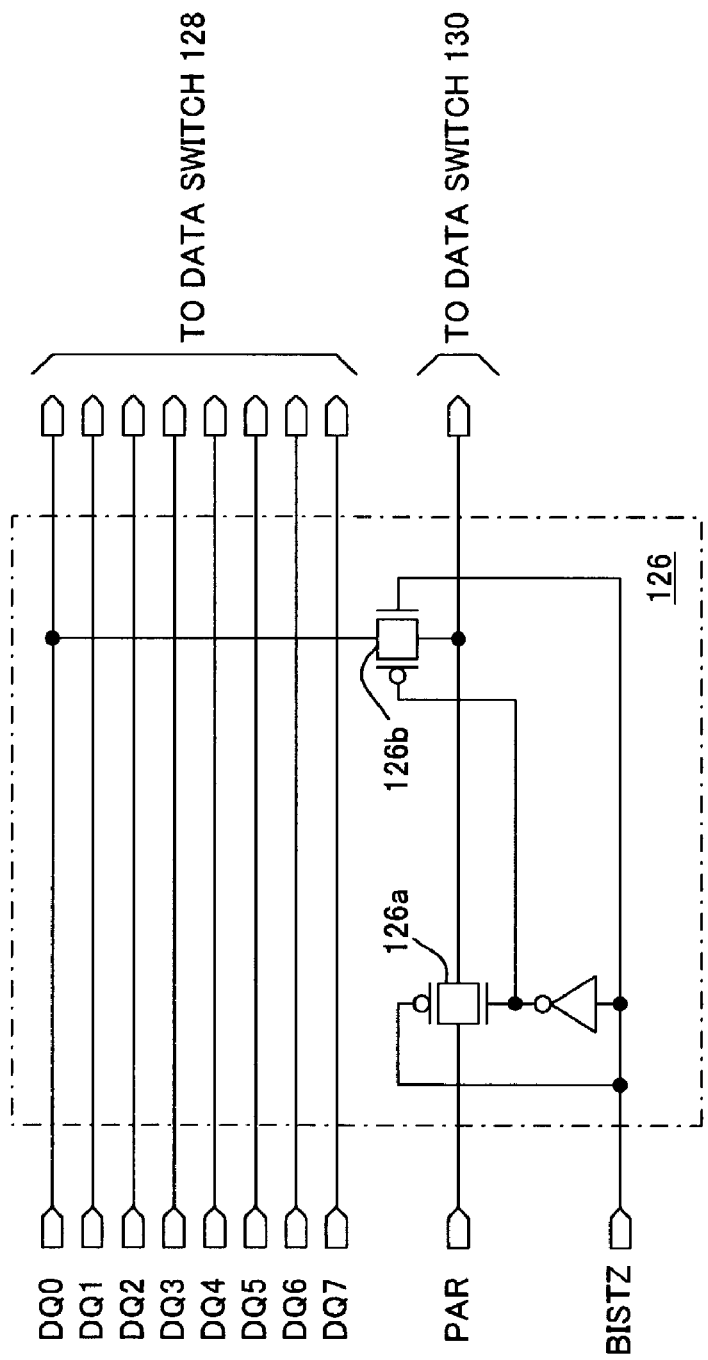
FIG. 13 is a circuit diagram showing details of the switch circuit in FIG. 11.

FIG. 13 shows details of the first switch circuit 126 shown in FIG. 11.

The first switch circuit 126 has a CMOS transfer gate 126a, which turns ON in accordance with a low level test mode signal BISTZ and outputs parity data PAR to the data switch 130, and has a CMOS transfer gate 126b, which turns ON in accordance with a high level test mode signal BISTZ to thereby output a data signal DQ0 to the data switch 130.

In the DRAM described hereinabove, at the time of a normal operation (during a write operation), the first switch circuit 126 connects the output of the parity generating circuit 124 to the input of the data switch 130 via the transfer gate 126a. Thus, parity data of the data signal DQ (write data) are written to the parity cell arrays PCA. The data signal DQ outputted from the data input/output buffer 122 is written directly to the real cell arrays RCA.

At the time of a readout operation, when a refresh operation for any of the real cell arrays RCA is being executed, the parity test circuit 142 recovers data, which are to be read out from a real cell array RCA undergoing the refresh operation, by using real readout data read out from the remaining respective real cell array RCA for which a refresh operation is not being executed and parity readout data read out from a parity cell array PCA. In other words, the DRAM executes refresh operations without external recognition.

On the other hand, at the time of a test mode, the test circuit 116 outputs a test pattern (write data) to the data input/output buffer 122. The first switch circuit 126 connects the output (DQ0) of the data input/output buffer 122 to the input of the data switch 130 via the transfer gate 126b. Thus, the data signal DQ0 (write data) is written to the parity cell arrays PCA. In other words, the first switch circuit 126 selects a portion of the write data generated by the test circuit 116 and outputs the selected data as a test pattern. The data signal DQ0 generated by the test circuit 116 is then written to the parity cell arrays PCA.

The test circuit 116 simultaneously receives real readout data read out from the real cell arrays RCA and parity readout data read out from the parity cell arrays PCA. The test circuit 116 judges whether or not the DRAM is operating correctly by directly comparing the real readout data and the parity readout data with expected values. The judgment circuit 118 judges a test result on the basis of a plurality of comparison results from the test circuit 116 and outputs the judgment result to the test output terminal TOUT. In other words, the result of a Built-in Self Test is outputted to outside the DRAM.

Thus, in DRAM which has parity cell arrays PCA for storing parity data, a Built-in Self Test is implemented to permit a test of the operation of the parity cell arrays PCA.

According to the present embodiment hereinabove, in a test mode, the first switch circuit 126 selects write data DQ0 generated by the test circuit 116 and outputs this data as a test pattern for the parity cell arrays PCA. Further, the test circuit 116 judges a test result by directly comparing real readout data and parity readout data with expected values. That is, according to the present invention, a Built-in Self Test for DRAM having parity cell arrays PCA is possible.

Furthermore, the test circuit 116 simultaneously receives real readout data and parity readout data via the real data bus line RDB and the parity data bus line PDB respectively, and compares the received data with expected values. Thus, the test circuit 116 is capable of simultaneously conducting a test for the real cell arrays RCA and the parity cell arrays PCA, whereby the test time can be shortened. A shortening of the test time permits a reduction in DRAM test costs (manufacturing costs).

The parity cell arrays PCA have the same structure as the real cell arrays RCA. As a result, it is possible to shorten the time required for the DRAM layout design.

Figure 14:
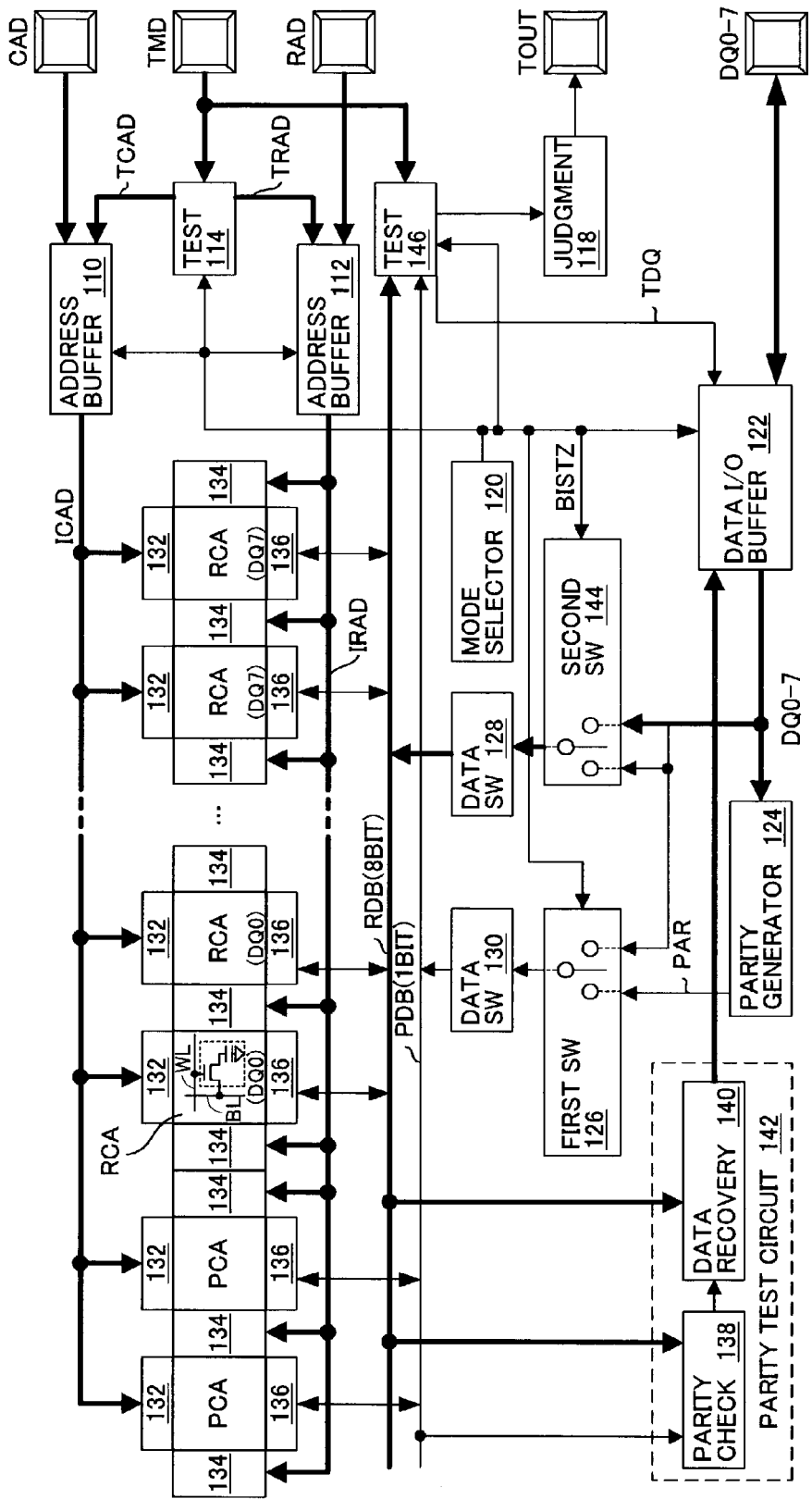
FIG. 14 is a block diagram showing another second embodiment of the semiconductor memory of the present invention.

FIG. 14 shows another second embodiment of the semiconductor memory of the present invention. Here, circuits and signals which are the same as the circuits and signals described in the embodiment in FIG. 11 have been assigned the same reference numerals and a detailed description thereof is thus omitted.

In this embodiment, the data input/output buffer 122 and the data switch 128 are connected via a second switch circuit 144. In addition, a test circuit 146 is formed in place of the test circuit 116 in FIG. 11. The remaining constitution is the same as for the embodiment in FIG. 11.

When the test mode signal BISTZ is at a low level (normal operation mode), the second switch circuit 144 selects data signals DQ0 to DQ7 of eight bits and, when the test mode signal BISTZ is at a high level (test mode), selects a data signal DQ0.

As a result, in a normal operation mode, data DQ0 to DQ7 are supplied to the real cell arrays RCA and parity data PAR are supplied to the parity cell arrays PCA. In a test mode, the data DQ0 is supplied simultaneously to all real cell arrays RCA and the parity cell arrays PCA.

When the test mode signal BISTZ is at a high level (test mode), the test circuit 146 operates in accordance with a combination of the test signal TMD supplied via the test terminal TMD, and serially outputs a 1-bit test data signal TDQ (test pattern) to the data input/output buffer 122. The data input/output buffer 122 outputs the data signal TDQ as the data signal DQ0. Similarly to the embodiment in FIG. 11, the test circuit 146 also simultaneously compares readout data transferred via the real data bus line RDB and the parity data bus line PDB with expected values and outputs the comparison result to the judgment circuit 118.

Figure 15:
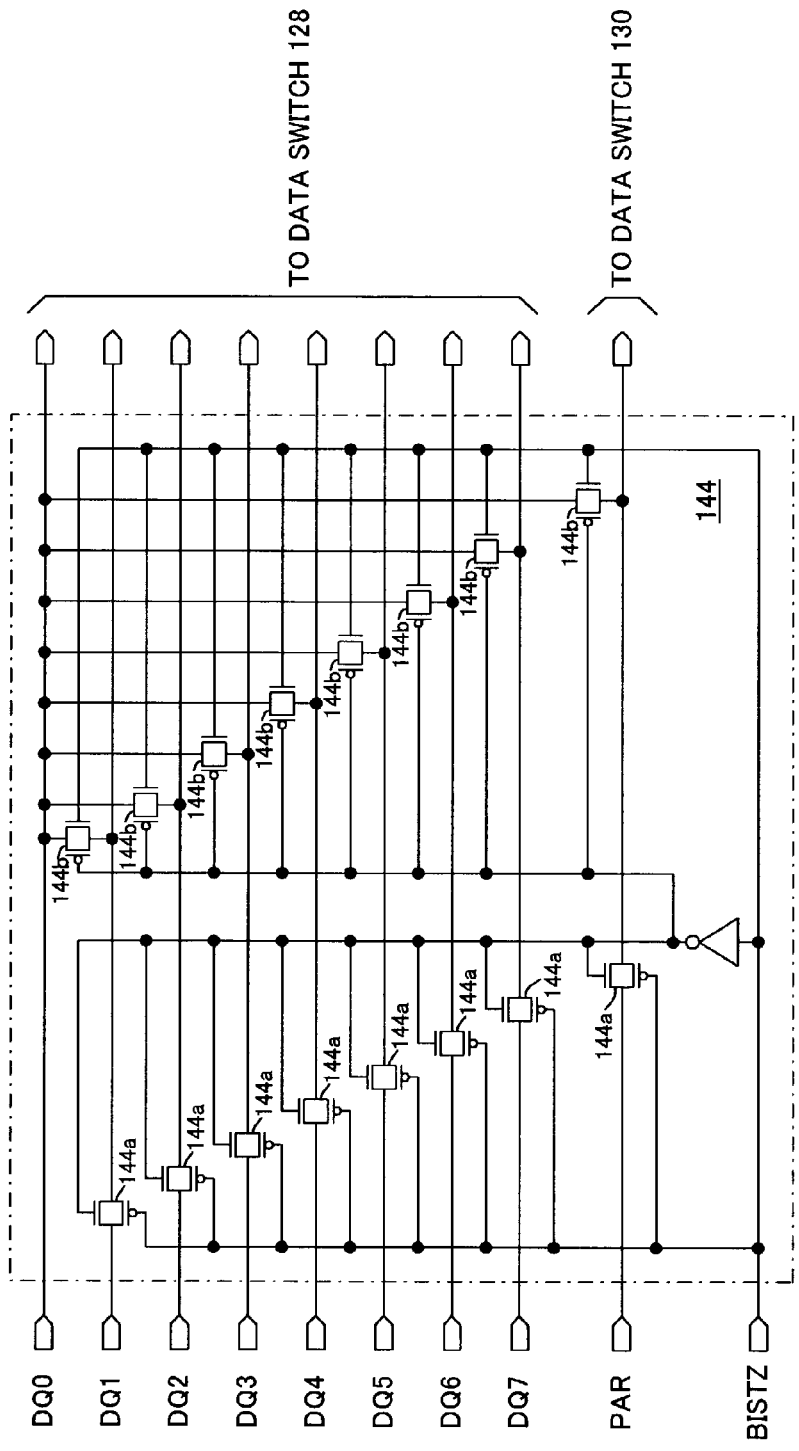
FIG. 15 is a circuit diagram showing details of the switch circuit in FIG. 14.

FIG. 15 shows details of the second switch circuit 144 shown in FIG. 14.

The second switch circuit 144 has a plurality of CMOS transfer gates 144a, and a plurality of CMOS transfer gates 144b. The CMOS transfer gates 144a turn ON in accordance with a low level test mode signal BISTZ and output data signals DQ0 to DQ7 and parity data PAR to the data switches 128, 130 respectively. The CMOS transfer gates 144b turn ON in accordance with a high level test mode signal BISTZ and output the data signal DQ0 as common write data to the data switches 128, 130.

With the DRAM described hereinabove, at the time of a test mode, a 1-bit test pattern (write data) DQ0 generated by the test circuit 146 is written to the parity cell arrays PCA and real cell arrays RCA corresponding with the data signals DQ0 to DQ7. Thereafter, the test circuit 146 simultaneously reads out data from the parity cell arrays PCA and real cell arrays RCA, and when all of the readout data match, it is judged that the DRAM is working correctly. In other words, in this embodiment, a data compression test is conducted. Here, a data compression test is a test which writes common data to memory cells corresponding with different data terminals.

Effects similar to those of the embodiment in FIG. 11 described hereinabove can also be obtained in this embodiment. In addition, in this embodiment, at the time of a test mode, a common data signal DQ0 is written to the real cell arrays RCA and the parity cell arrays PCA. That is, a data compression test is conducted. Thus, the bit count of the test pattern generated by the test circuit 146 can be minimized and the scale of the test pattern generating circuit within the test circuit 146 can be reduced. As a result, it is possible to reduce the DRAM chip size.

Figure 16:
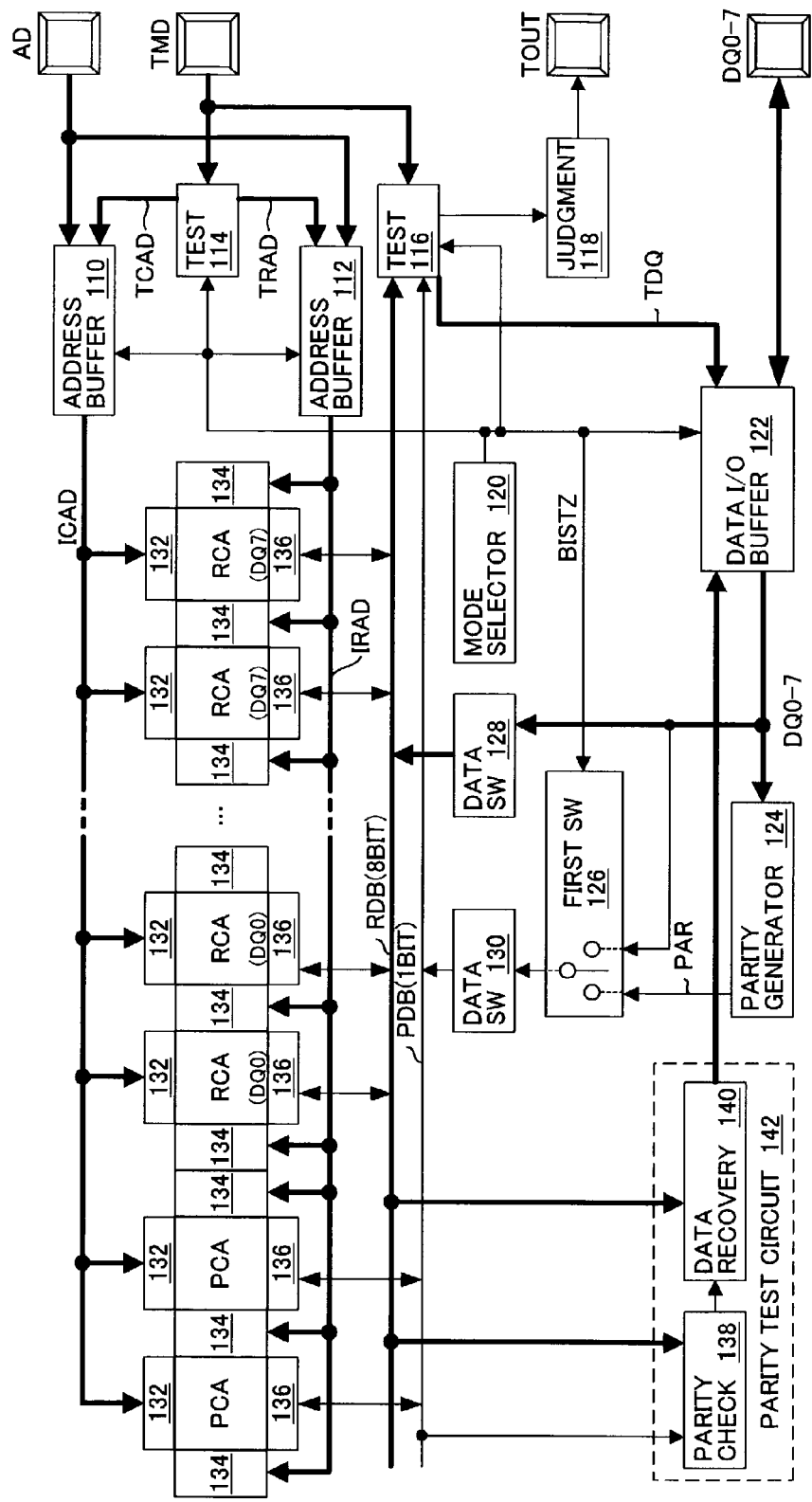
FIG. 16 is a block diagram showing yet another second embodiment of the semiconductor memory of the present invention.

FIG. 16 shows another examplifierle of the second embodiment. Here, circuits and signals which are the same as the circuits and signals described in the embodiment in FIG. 11 have been assigned the same reference numerals and a detailed description thereof is thus omitted.

The semiconductor memory is formed as SRAM using a CMOS process on a silicon substrate. The SRAM receives an address signal AD supplied from an address terminal AD via each of the address buffers 110, 112. That is, a column address and a row address are supplied by means of time division from the common address terminal AD. Further, the real cell arrays RCA and the parity cell arrays PCA have SRAM memory cells. The remaining constitution for the embodiment in FIG. 16 is substantially the same as the embodiment in FIG. 11.

In this embodiment, the parity cell arrays PCA are used for error detection and error correction of write data written to the real cell arrays RCA.

Effects similar to those of the embodiment in FIG. 11 described hereinabove can also be obtained in this embodiment. In addition, in a semiconductor memory having an error detection and correction function, a Built-in Self Test is also conducted, whereby the test time can be shortened.

Figure 17:
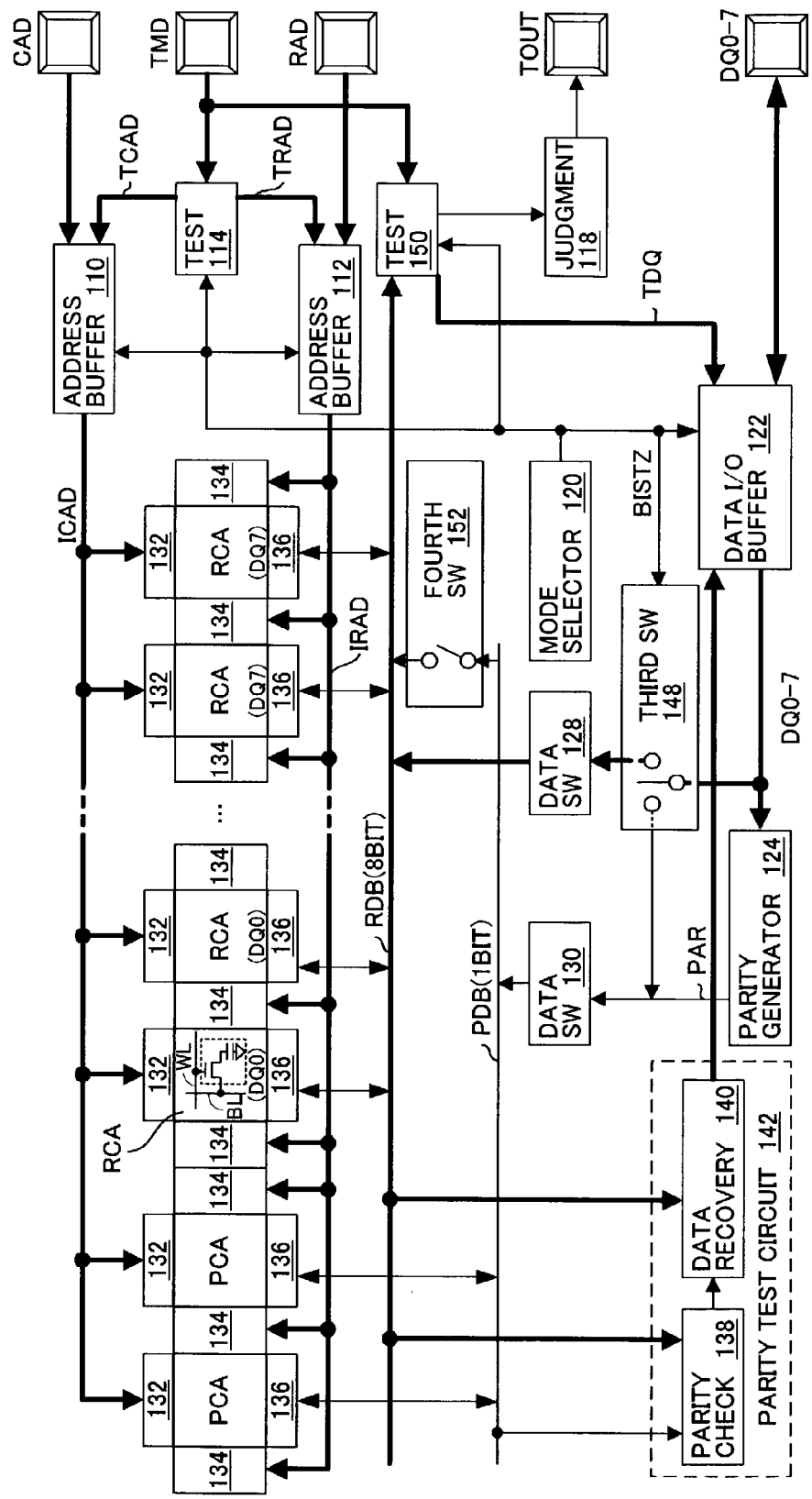
FIG. 17 is a block diagram showing a semiconductor memory investigated by the present inventors prior to making the present invention.

FIG. 17 is a block diagram showing a semiconductor memory investigated by the present inventors prior to making the present invention. Here, circuits and signals which are the same as the circuits and signals described in the embodiment in FIG. 11 have been assigned the same reference numerals and a detailed description thereof is thus omitted. The circuit block diagram shown in FIG. 17 is not yet publicly known.

In this example, a third switch circuit 148 and a test circuit 150 are respectively formed in place of the first switch circuit 126 and the test circuit 116 of the embodiment in FIG. 11. Furthermore, the parity data bus line PDB is connected to the real data bus line RDB corresponding with the data signals DQ via a fourth switch circuit 152.

At the time of a test mode, the real cell arrays RCA and parity cell arrays PCA are tested separately. In other words, when testing the real cell arrays RCA, the third switch circuit 148 connects the output of the data input/output buffer 122 with the data switch 128. The fourth switch circuit 152 is turned OFF. Then the test circuit 152 generates a test pattern for testing the real cell arrays RCA, and compares readout data from the real cell arrays RCA with expected values.

When testing the parity cell arrays PCA, the third switch circuit 148 connects the output (DQ0) of the data input/output buffer 122 with the data switch 130. As a result, the test circuit 152 generates a 1-bit test pattern for testing the parity cell arrays PCA and data DQ0 is written to parity cell arrays PRC. Further, during readout, the fourth switch circuit 152 is turned ON. Therefore, the test circuit 152 receives readout data from the parity cell arrays PCA via the parity bit data bus PDB, the fourth switch circuit 152 and the real cell data bus line RDB, and compares this readout data with expected values.

The DRAM shown in FIG. 17 tests the real cell arrays RCA and the parity cell arrays PCA separately, which prolongs the test time.

Figure 18:
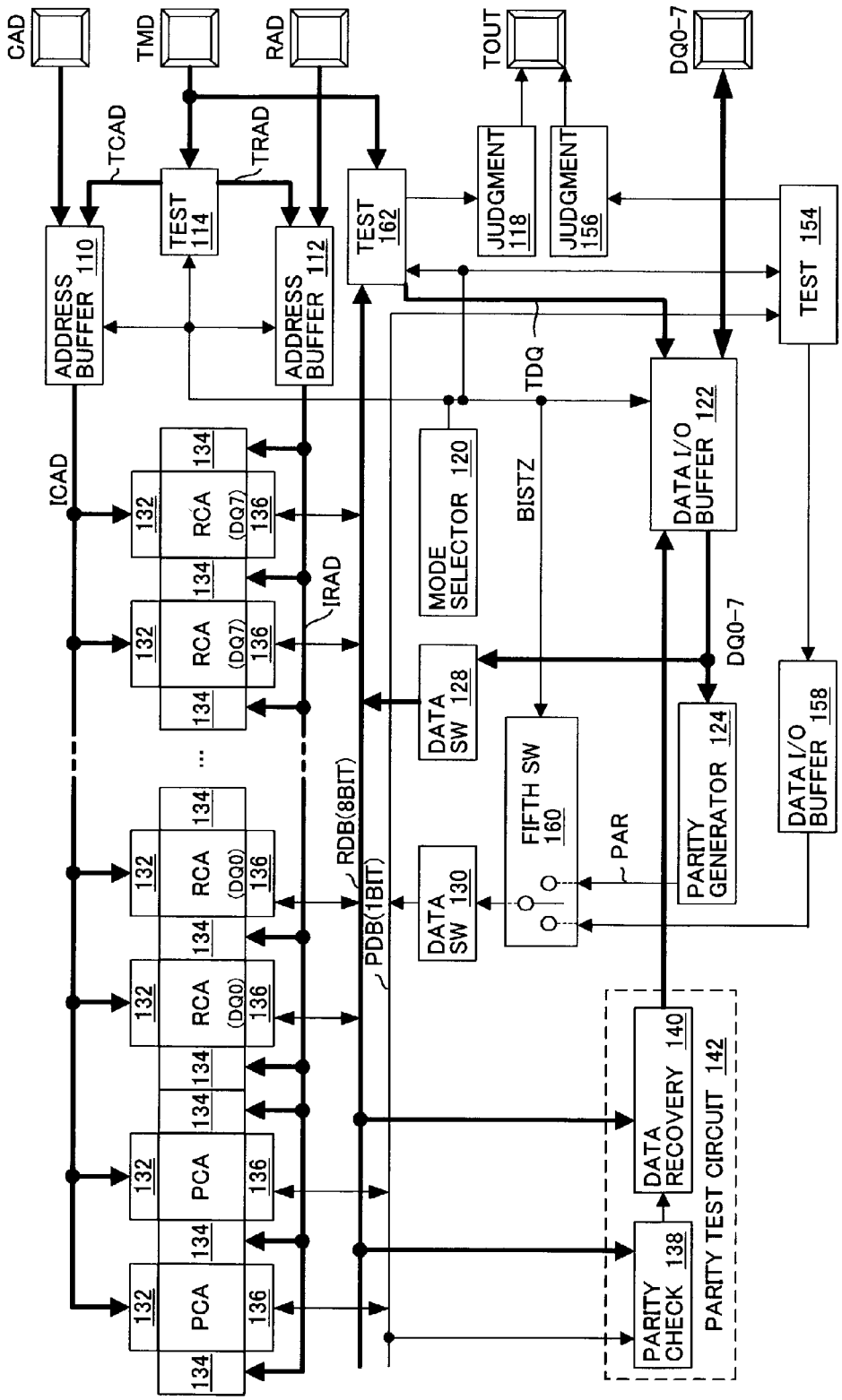
FIG. 18 is a block diagram showing another semiconductor memory investigated by the present inventors prior to making the present invention.
Figure 19:
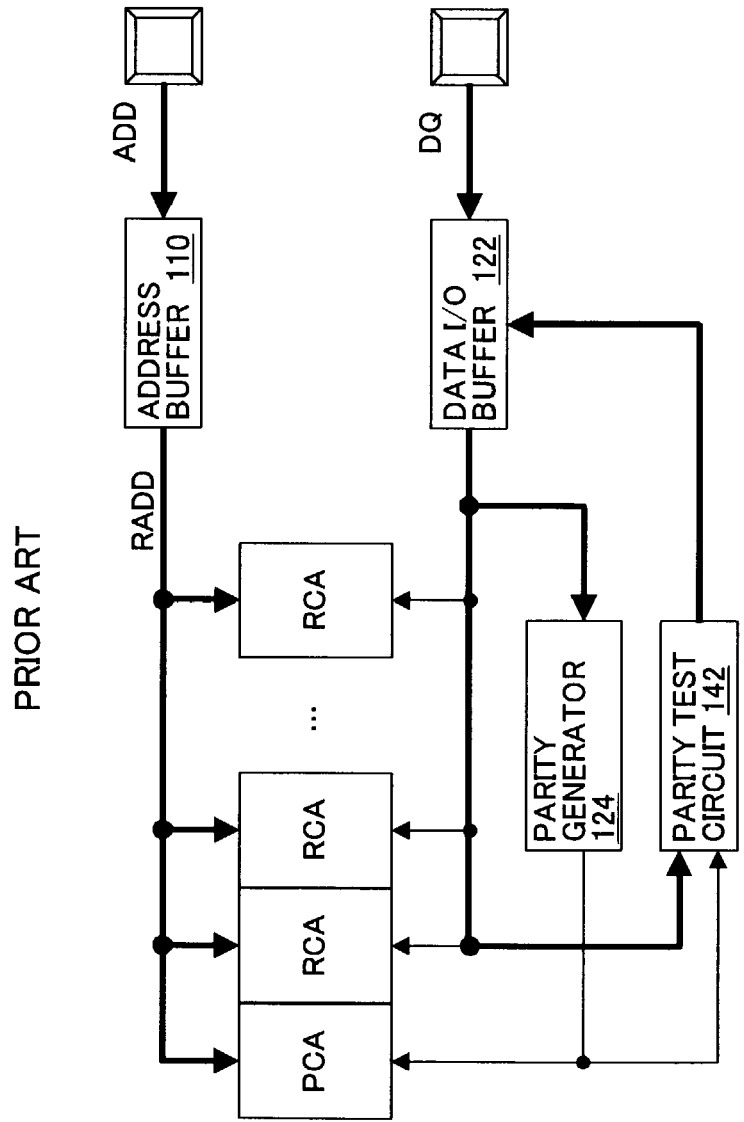
FIG. 19 is a circuit diagram showing an outline of conventional DRAM.

FIG. 18 is another block diagram of a semiconductor memory investigated by the present inventors prior to making the present invention. Circuits and signals which are the same as the circuits and signals described in the embodiment in FIG. 11 have been assigned the same reference numerals and a detailed description thereof is thus omitted. The circuit block diagram shown in FIG. 18 is not yet publicly known.

In this example, a dedicated test circuit 154 for testing the parity cell arrays PCA, a judgment circuit 156, and a data input/output buffer 158 (dummy circuit for the data input/output buffer 122) are newly provided. Further, a fifth switch circuit 160 and a test circuit 162 are provided in place of the first switch circuit 126 and the test circuit 116 of the embodiment in FIG. 11.

The fifth switch circuit 160 connects the output of the parity generating circuit 124 with the data switch 130 at the time of a normal operation mode, and connects the output of the data input/output buffer 158 with the data switch 130 at the time of a test mode. Further, the test circuit 162 tests the real cell arrays RCA and the test circuit 154 tests the parity cell arrays PCA.

The DRAM shown in FIG. 18 requires the test circuits 162, 154 in order to test the real cell arrays RCA and the parity cell arrays PCA. Consequently, the scale of the test circuit and the DRAM chip size become large.

According to the above embodiment, parity bits are generated and recorded in parity cell arrays and, during readout of a real cell array, a parity bit is used to recover data. As described hereinabove, data recovery may also be performed by generating an ECC code in place of a parity bit, recording the ECC code in an ECC cell array and using this ECC during readout of a real cell array. The test control of the present embodiment can be applied in this case also.

According to the present invention hereinabove, real and parity cell arrays operation test can be suitably employed in a memory circuit having real cell arrays and parity cell arrays.

With the semiconductor memory of the present invention, when, at the time of a normal operation mode, the output of correct data is not possible from any of the real cell arrays, correct data can be read out through data recovered using parity data.

At the time of a test mode, a portion of write data is written directly to parity cell arrays rather than parity data generated from write data. Further, the test judgment circuit directly compares parity readout data from the parity cell arrays with expected values. As a result, the test judgment circuit is capable of conducting a Built-in Self Test of parity cell arrays, which has been impossible conventionally, by using a test circuit that is formed in the semiconductor memory.

Since it is possible to simultaneously compare real readout data and parity readout data with expected values by means of the test judgment circuit, the test time can be shortened. A shortening of the test time permits a reduction in the manufacturing costs for semiconductor memory.

Further, according to the semiconductor memory of the present invention, in a semiconductor memory which executes a refresh operation without recognition by an external device, a Built-in Self Test can be conducted, whereby the test time can be shortened.

Furthermore, according to the semiconductor memory of the present invention, in a semiconductor memory which has an error detection and correction function, a Built-in Self Test can be conducted, whereby the test time can be shortened.

Moreover, according to the semiconductor memory of the present invention, it is no longer necessary to design a parity cell array, meaning that it is possible to shorten the time required for the layout design.

In addition, according to the semiconductor memory of the present invention, the bit count of a generated test pattern can be reduced such that the scale of the pattern generating circuit can be reduced. As a result, it is possible to reduce the semiconductor memory chip size.

What is claimed is:

1. A memory circuit, having:
   a real cell array for storing data;
   a parity or error correction code (ECC) generating circuit for generating a parity bit or an ECC from data of said real cell array;
   a parity or ECC cell array for storing said parity bit or ECC;
   a refresh control circuit, which generates an internal refresh request signal at a predetermined cycle, sequentially refreshes the real cell array in accordance with a refresh address, and, when an internal refresh request and a read request coincide, prioritizes a refresh operation for the real cell array;
   a data recovery section, which, in accordance with the parity bit or ECC read out from said parity or ECC cell array, recovers data read out from the real cell array for which the refresh operation has been prioritized;
   an output circuit for outputting data from said real cell array via said data recovery section; and
   a test control circuit, which, at a first test mode, prohibits a refresh operation for said real cell array to thereby output data read out from said real cell array, and, at a second test mode, controls said output circuit so as to output data read out from said parity or ECC cell array.

2. The memory circuit according to claim 1, wherein, in response to the provision of a first test command, said test control circuit is controlled in said first test mode, and, in response to a second test command different from said first test command, said test control circuit is controlled in said second test mode.

3. The memory circuit according to claim 1, wherein, in response to the provision of a test command, said test control circuit enters a test mode and, in the test mode, switches between the first test mode and second test mode in accordance with a state of an external signal.

4. The memory circuit according to claim 3, wherein said external signal comprises a signal which is not contained in an operation command at said test mode.

5. The memory circuit according to claim 1, wherein, in said first test mode, a recovery function of said data recovery section is prohibited and data of the real cell array are outputted from said output circuit without being recovered.

6. A memory circuit, having:
   a real cell array for storing data;
   a parity or error correction code (ECC) generating circuit for generating a parity bit or an ECC from data of said real cell array;
   a parity or ECC cell array for storing said parity bit or ECC;
   a data recovery section, which, in accordance with the parity bit or ECC read out from said parity or ECC cell array, recovers data read out from said real cell array;
   an output circuit, which outputs data from said real cell array via said data recovery section; and a test control circuit, which, at a test mode, prohibits the recovery of readout data by said data recovery section.

7. A memory circuit, having:
a real cell array for storing data;
a parity or error correction code (ECC) generating circuit for generating a parity bit or an ECC from data of said real cell array;
a parity or ECC cell array for storing said parity bit or ECC;
a data recovery section, which, in accordance with the parity bit or ECC read out from said parity or ECC cell array, recovers data read out from said real cell array;
an output circuit, which outputs data from said real cell array; and
a test control circuit, which, at a test mode, controls said output circuit so as to output data read out from said parity or ECC cell array.

8. A memory circuit, having:
a real cell array for storing data;
a parity or error correction code (ECC) generating circuit for generating a parity bit or an ECC from data of said real cell array;
a parity or ECC cell array for storing said parity bit or ECC;
a data recovery section, which, in accordance with the parity bit or ECC read out from said parity or ECC cell array, recovers data read out from said real cell array;
an output circuit, which outputs data from said real cell array via said data recovery section; and
a test control circuit, which, at a first test mode, prohibits the recovery of readout data in said data recovery section and, at a second test mode, controls said output circuit so as to output data read out from said parity or ECC cell array.

9. The memory circuit according to claim 8, wherein, in response to the provision of a first test command, said test control circuit is controlled in said first test mode, and, in response to a second test command different from said first test command, said test control circuit is controlled in said second test mode.

10. The memory circuit according to claim 8, wherein, in response to the provision of a test command, said test control circuit enters a test mode and, in the test mode, switches between said first test mode and second test mode in accordance with a state of an external signal.

11. A memory circuit, having:
a real cell array for storing data;
a parity or error correction code (ECC) generating circuit for generating a parity bit or an ECC from data of said real cell array;
a parity or ECC cell array for storing said parity bit or ECC;
a data recovery section, which, in accordance with the parity bit or ECC read out from said parity or ECC cell array, recovers data read out from said real cell array;
an output circuit, which outputs data from said real cell array; and
a test control circuit, which, at a test mode, controls data read out from said parity or ECC cell array and data read out from said real cell array to be outputted separately.

12. A semiconductor memory, comprising:
a plurality of real cell arrays, which have memory cells for storing each of the write data supplied via a plurality of data terminals;
a parity generating circuit for generating parity data of said write data;
a pattern generating circuit, which, at a test mode, generates a test pattern and outputs said generated test pattern to a transmission path for said write data;
a first switch circuit, which selects said parity data at a normal operation mode and selects a portion of said write data at the test mode;
a parity cell array, which has memory cells for storing said parity data or a portion of said write data selected by said first switch circuit;
a data recovery circuit, which, at said normal operation mode, recovers said write data on the basis of real readout data read out from said real cell arrays and parity readout data read out from said parity cell array; and
a test judgment circuit, which, at said test mode, receives real readout data read out from said real cell arrays and parity readout data read out from said parity cell array and judges a test result by comparing the real readout data and parity readout data with expected values.

13. The semiconductor memory according to claim 12, wherein said memory cells of said real cell arrays each comprise a capacitor for storing said write data as electrical charge; refresh operations for rewriting said write data held in said memory cells are executed sequentially for each of said real cell arrays; and said data recovery circuit recovers said write data of said real cell arrays undergoing a refresh operation.

14. The semiconductor memory according to claim 12, wherein said data recovery circuit detects an error in said real readout data read out from said real cell arrays and corrects the error to produce corrected data.

15. The semiconductor memory according to claim 12, wherein said parity cell array has the same storage capacity and the same structure as said real cell arrays.

16. The semiconductor memory according to claim 12, comprising a second switch circuit, which, at said normal operation mode, outputs said write data to said real cell arrays respectively, and, at said test mode, outputs a portion of said write data selected by said first switch circuit to said real cell arrays as common write data.

17. The semiconductor memory according to claim 12, wherein, at said normal operation mode, parity data generated by said parity generating circuit is written to said parity cell array via said first switch circuit, and, at said test mode, a portion of said test pattern generated by said pattern generating circuit is written to said parity cell array via said first switch circuit.

18. The semiconductor memory according to claim 17, comprising a second switch circuit, which, at said normal operation mode, supplies said write data to said real cell arrays respectively, and, at said test mode, supplies a portion of said write data selected by said first switch circuit to said real cell arrays as common write data.

* * * * *